United States Patent [19]
Kusumoto et al.

[11] Patent Number: 5,835,552
[45] Date of Patent: *Nov. 10, 1998

[54] TIME COUNTING CIRCUIT AND COUNTER CIRCUIT

[75] Inventors: Keiichi Kusumoto, Hyogo; Shiro Dosho; Yutaka Terada, both of Osaka; Akira Matsuzawa, Kyoto, all of Japan

[73] Assignee: Matsushita Electric Industrial Co.,Ltd., Osaka, Japan

[*] Notice: The term of this patent shall not extend beyond the expiration date of Pat. No. 5,828,717.

[21] Appl. No.: 747,129

[22] Filed: Nov. 12, 1996

Related U.S. Application Data

[63] Continuation-in-part of Ser. No. 624,960, Mar. 27, 1996.

[30] Foreign Application Priority Data

Nov. 13, 1995 [JP] Japan .................................. 7-293894

[51] Int. Cl.$^6$ ...................................................... G01B 7/00
[52] U.S. Cl. .............................................. 377/24; 377/20
[58] Field of Search ........................................ 377/20, 24

[56] References Cited

U.S. PATENT DOCUMENTS

| | | | |
|---|---|---|---|
| 4,370,067 | 1/1983 | Iwakura et al. | 377/20 |
| 4,908,784 | 3/1990 | Box et al. | 377/20 |
| 4,953,095 | 8/1990 | Ishikawa et al. | 377/20 |
| 5,166,959 | 11/1992 | Chu et al. | 377/20 |

OTHER PUBLICATIONS

T. Wtanabe et al., "A Time–to–Digital Converter LSI", Technical Report of IEICE, pp. 37–43.

*Primary Examiner*—Margaret Rose Wambach
*Attorney, Agent, or Firm*—McDermott, Will & Emery

[57] ABSTRACT

There is provided a time counting circuit for measuring a pulse spacing of a pulse signal with high accuracy and with low power consumption. An inverter ring composed of an odd number of inverters connected in a ring oscillates and one signal transition occurs after another as though seemingly circulating around the inverter ring. Holding circuits connected to respective output terminals of the inverters composing the inverter ring output, on the rising edge of a pulse signal to be measured, signals outputted from the inverters at the same time. The outputted signals are then converted by a signal converting circuit to numeric data. A counter circuit connected to the output terminal of one of the inverters composing the inverter ring counts the number of circulations of signal transition. A time-difference operating circuit corrects the numeric data outputted from the signal converting circuit based on the number of circulations of signal transition outputted from the counter circuit to provide time data, while calculating and outputting the pulse spacing of the pulse signal to be measured.

8 Claims, 19 Drawing Sheets

FIG.2

| TIME | OUTPUT FROM INVERTER RING | INPUT TO ENCODER | OUTPUT FROM ENCODER |
|---|---|---|---|
| 0 | 0 1 0 1 0 ... 0 1 0 1 0 | 0 0 0 0 0 ... 0 0 0 0 0 | 0 0 0 0 0 0 |
| 1 | 1 1 0 1 0 ... 0 1 0 1 0 | 1 0 0 0 0 ... 0 0 0 0 0 | 0 0 0 0 0 1 |
| 2 | 1 0 0 1 0 ... 0 1 0 1 0 | 1 1 0 0 0 ... 0 0 0 0 0 | 0 0 0 0 1 0 |
| 3 | 1 0 1 1 0 ... 0 1 0 1 0 | 1 1 1 0 0 ... 0 0 0 0 0 | 0 0 0 0 1 1 |
| 4 | 1 0 1 0 0 ... 0 1 0 1 0 | 1 1 1 1 0 ... 0 0 0 0 0 | 0 0 0 1 0 0 |
| ⋮ | ⋮ | ⋮ | ⋮ |
| 29 | 1 0 1 0 1 ... 1 1 0 1 0 | 1 1 1 1 1 ... 1 0 0 0 0 | 0 1 1 1 0 1 |
| 30 | 1 0 1 0 1 ... 1 0 0 1 0 | 1 1 1 1 1 ... 1 1 0 0 0 | 0 1 1 1 1 0 |
| 31 | 1 0 1 0 1 ... 1 0 1 1 0 | 1 1 1 1 1 ... 1 1 1 0 0 | 0 1 1 1 1 1 |
| 32 | 1 0 1 0 1 ... 1 0 1 0 0 | 1 1 1 1 1 ... 1 1 1 1 0 | 1 0 0 0 0 0 |
| 33 | 1 0 1 0 1 ... 1 0 1 0 1 | 1 1 1 1 1 ... 1 1 1 1 1 | 0 0 0 0 0 0 |
| 34 | 0 0 1 0 1 ... 1 0 1 0 1 | 0 1 1 1 1 ... 1 1 1 1 1 | 0 0 0 0 0 1 |
| 35 | 0 1 1 0 1 ... 1 0 1 0 1 | 0 0 1 1 1 ... 1 1 1 1 1 | 0 0 0 0 1 0 |
| 36 | 0 1 0 0 1 ... 1 0 1 0 1 | 0 0 0 1 1 ... 1 1 1 1 1 | 0 0 0 0 1 1 |
| 37 | 0 1 0 1 1 ... 1 0 1 0 1 | 0 0 0 0 1 ... 1 1 1 1 1 | 0 0 0 1 0 0 |
| 38 | 0 1 0 1 0 ... 1 0 1 0 1 | 0 0 0 0 0 ... 1 1 1 1 1 | 0 0 0 1 0 1 |
| ⋮ | ⋮ | ⋮ | ⋮ |
| 62 | 0 1 0 1 0 ... 0 0 1 0 1 | 0 0 0 0 0 ... 0 1 1 1 1 | 0 1 1 1 0 1 |
| 63 | 0 1 0 1 0 ... 0 1 1 0 1 | 0 0 0 0 0 ... 0 0 1 1 1 | 0 1 1 1 1 0 |
| 64 | 0 1 0 1 0 ... 0 1 0 0 1 | 0 0 0 0 0 ... 0 0 0 1 1 | 0 1 1 1 1 1 |
| 65 | 0 1 0 1 0 ... 0 1 0 1 1 | 0 0 0 0 0 ... 0 0 0 0 1 | 1 0 0 0 0 0 |

FIG.3

| TIME | INVERTER | OUTPUT FROM COUNTER (UPPER BITS) | OUTPUT FROM ENCODER (LOWER BITS) | ADDITION VALUE | TIME DATA |
|---|---|---|---|---|---|
| 0 | 1 | 000000 | 0, 00000 | 000000 | 0, 000000, 00000 |
| 1 | 2 | | 0, 00001 | | 0, 000000, 00001 |
| 2 | 3 | | 0, 00010 | | 0, 000000, 00010 |
| ⋮ | ⋮ | | ⋮ | | ⋮ |
| 30 | 31 | | 0, 11110 | | 0, 000000, 11110 |
| 31 | 32 | | 0, 11111 | | 0, 000000, 11111 |
| 32 | 33 | ↓ | 1, 00000 | ↓ | 0, 000001, 00000 |
| 33 | 1 | 000001 | 0, 00000 | 000001 | 0, 000001, 00001 |
| 34 | 2 | | 0, 00001 | | 0, 000001, 00010 |
| 35 | 3 | | 0, 00010 | | 0, 000001, 00011 |
| ⋮ | ⋮ | | ⋮ | | |
| 63 | 31 | | 0, 11110 | | 0, 000001, 11111 |
| 64 | 32 | | 0, 11111 | | 0, 000010, 00000 |
| 65 | 33 | ↓ | 1, 00000 | ↓ | 0, 000010, 00001 |
| 66 | 1 | 000010 | 0, 00000 | 000010 | 0, 000010, 00010 |
| 67 | 2 | | 0, 00001 | | 0, 000010, 00011 |
| 68 | 3 | | 0, 00010 | | 0, 000010, 00100 |
| ⋮ | ⋮ | | ⋮ | | |
| 96 | 31 | | 0, 11110 | | 0, 000011, 00000 |
| 97 | 32 | | 0, 11111 | | 0, 000010, 00001 |
| 98 | 33 | ↓ | 1, 00000 | ↓ | 0, 000010, 00010 |
| ⋮ | ⋮ | | ⋮ | | ⋮ |
| 1023 | 1 | 011111 | 0, 00000 | 011111 | 0, 011111, 11111 |
| 1024 | 2 | | 0, 00001 | | 0, 100000, 00000 |
| ⋮ | ⋮ | | | | |
| 1053 | 31 | | 0, 11110 | | 0, 100000, 11101 |
| 1054 | 32 | | 0, 11111 | | 0, 100000, 11110 |
| 1055 | 33 | ↓ | 1, 00000 | ↓ | 0, 100000, 11111 |
| 1056 | 1 | 100000 | 0, 00000 | 100000 | 0, 100001, 00000 |
| 1057 | 2 | | 0, 00001 | | 0, 100001, 00001 |
| ⋮ | ⋮ | | | | |
| 1086 | 31 | | 0, 11110 | | 0, 100001, 11110 |
| 1087 | 32 | | 0, 11111 | | 0, 100001, 11111 |
| 1088 | 33 | ↓ | 1, 00000 | ↓ | 0, 100010, 00000 |
| ⋮ | ⋮ | | ⋮ | | ⋮ |
| 2046 | 1 | 111110 | 0, 00000 | 111110 | 0, 111111, 11110 |
| 2047 | 2 | | 0, 00001 | | 0, 111111, 11111 |
| ⋮ | ⋮ | | | | ⋮ |
| 2076 | 31 | | 0, 11110 | | 1, 000000, 11100 |
| 2077 | 32 | | 0, 11111 | | 1, 000000, 11101 |
| 2078 | 33 | ↓ | 1, 00000 | ↓ | 1, 000000, 11110 |
| 2079 | 1 | 111111 | 0, 00000 | 111111 | 1, 000000, 11111 |
| 2080 | 2 | | 0, 00001 | | 1, 000001, 00000 |
| ⋮ | ⋮ | | | | |
| 2109 | 31 | | 0, 11110 | | 1, 000001, 11101 |
| 2110 | 32 | | 0, 11111 | | 1, 000001, 11110 |
| 2111 | 33 | ↓ | 1, 00000 | ↓ | 1, 000001, 11111 |

WHEN 1ST PULSE HOLDS TIME T BETWEEN 1ns AND 2ns

| 2 ND PULSE | 3 RD PULSE | 4 TH PULSE | RESULT |
|---|---|---|---|
| 3 > | 3 > | 3 > | $1.0 \leq T \leq 1.25$ |
| 3 > | 3 > | 3 < | $1.25 \leq T \leq 1.5$ |
| 3 > | 3 < | 3 < | $1.5 \leq T \leq 1.75$ |
| 3 < | 3 < | 3 < | $1.75 \leq T \leq 2.0$ |

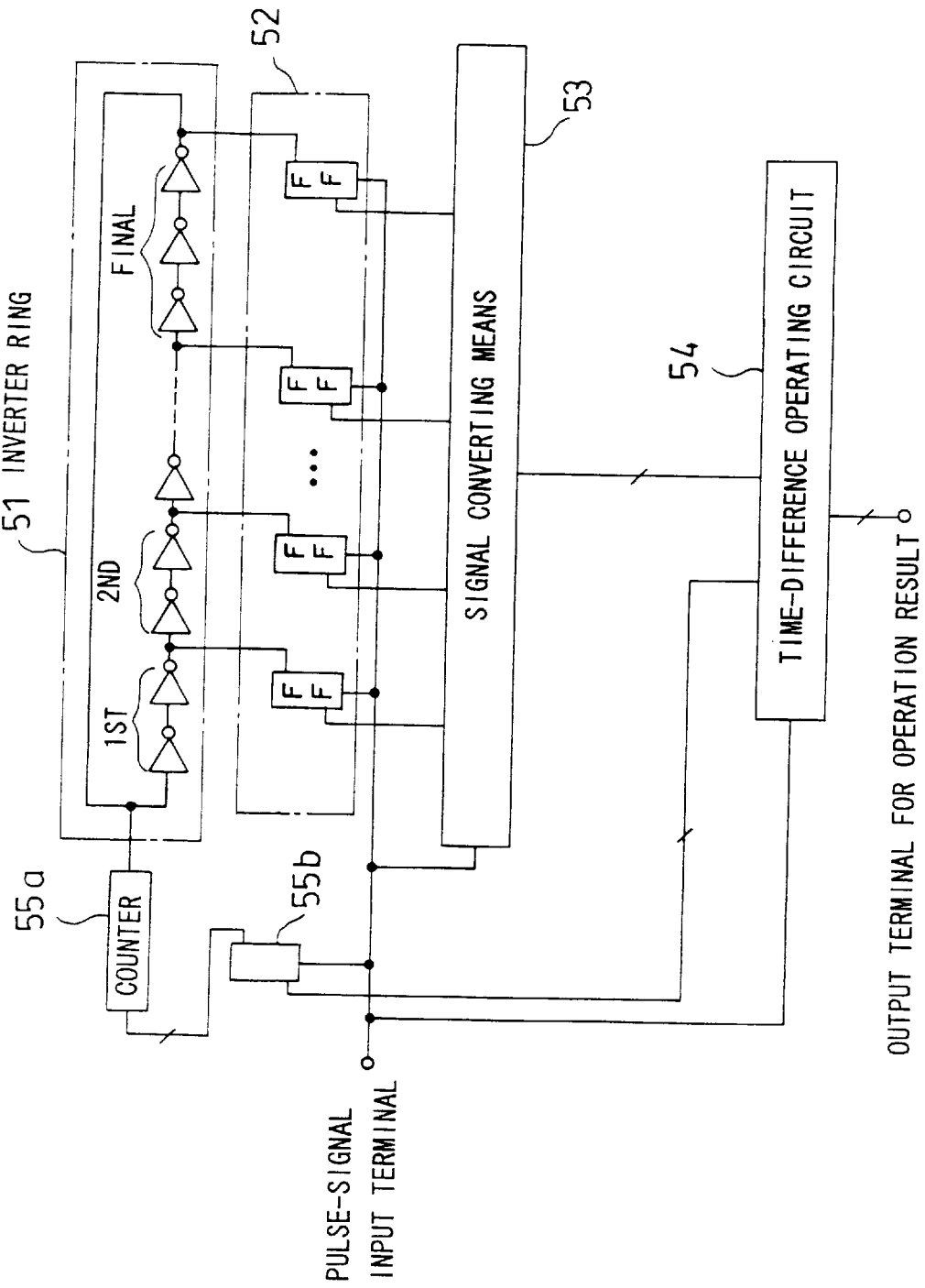

TIME COUNTING CIRCUIT AND COUNTER CIRCUIT

This application is Continuation-In-Part of application Ser. No. 08/624,960, filed Mar. 27, 1996, now abandoned.

BACKGROUND OF THE INVENTION

The present invention relates to time counting circuits for measuring such time as the pulse spacing of a pulse signal and to counter circuits.

Time counting circuits for measuring such time as the pulse spacing of a pulse signal have been made frequent use of in the field of digital communication and the like. In recent years, it has become possible to mount a time counting circuit composed of a CMOS transistor in conjunction with other digital circuits on a single chip, which has accomplished a significant reduction in the cost of manufacturing semiconductor devices.

A time counting circuit which exhibits further stabilized operation with higher accuracy may also find extensive application in various fields including the modulation of FM signals and the demodulation of bus signals in an LSI. If a time counting circuit capable of measuring an extremely short time with accuracy and stability can be utilized for the demodulation of bus signals in an LSI, the number of buses in the LSI can be reduced significantly.

FIG. 12 shows an example of the structure of a conventional time counting circuit, in which are shown: an inverter ring (IR) 51; a row of holding circuits 52; signal converting means 53; time-difference operating circuit 54; a counter 55a; and a counter-output holding circuit 55b. A pulse-signal input terminal receives a pulse signal to be measured and an operation-result output terminal outputs time corresponding to the pulse spacing of the inputted pulse signal.

The time counting circuit shown in FIG. 12 includes the inverter ring 51 composed of a plurality of delay circuits each consisting of two inverters and one delay circuit consisting of three inverters (the final delay circuit in FIG. 12), which are connected in a ring. Since the inverter ring 51 is composed of the odd number of inverters, so-called oscillation is observed whereby one signal transition occurs after another as though seemingly moving along the inverter ring 51 with the passage of time, resulting in circulations around the inverter ring 51. Therefore, time can be measured by examining variations in the output voltages from the respective delay circuits.

The output voltages from the respective delay circuits composing the inverter ring 51 are held in flip-flops (FFs) composing the row of holding circuits 52. When the pulse to be measured rises, it is outputted to the signal converting means 53, which converts the output voltage from each of the delay circuits to data and outputs it to the time-difference operating circuit 54. The counter 55a counts the number of circulations of signal transition around the inverter ring 51 and outputs count data to the time-difference operating circuit 54 via the counter-output holding circuit 55b (see "Time-to-Digital Converter LSI" Technical Report of IEICE, ICD93-77 (1993-08)).

However, the conventional time counting circuit has the following disadvantages.

To achieve oscillation in the inverter ring, an odd number of inverters should necessarily be provided therein. To simplify the structure of the subsequent operating circuit, a power-of-two number of delay circuits are preferably included in the inverter ring. Accordingly, the inverter ring of the conventional time counting circuit comprises delay circuits of different structures, as shown in FIG. 12.

However, it is difficult to equalize signal delay times for all the delay circuits composing the inverter ring because of their different structures. Even if the inverter ring is designed so that signal delay times for all the delay circuits become equal, signal delay times may vary differently for the delay circuits of different structures when a power-source voltage varies. Hence, the conventional time counting circuit is disadvantageous in that linearity is not ensured for the relationship between measured time data and real time.

On the other hand, the counter which counts the number of circulations of signal transition around the inverter ring performs the operation of adding 1 to the output data every time the input signal changes. Since the adding operation requires a given period of time, correct data cannot be outputted when the pulse signal to be measured rises during the given period of time and the row of counter-output holding circuits connected to the counter initiate holding operation, resulting in the occurrence of an error. The error would exert a crucial influence that cannot be ignored on the accuracy with which time data is measured, since the output data from the counter occupies the upper bits of the time data.

Moreover, the influence of the error becomes far more serious in a field to which the present inventors are examining the application of time counting circuits than in a conventional application field, since a time counting circuit in which a delay time per delay circuit is 1 ns or less is in demand in the application field under examination, while the adding operation of the counter requires a minimum time on the order of 5 ns.

The conventional time counting circuit also has the following disadvantage.

The inverter ring, which functions as an oscillator, consumes a large amount of power so that the number of the delay circuits included therein should be minimized in order to lower power consumption. On the other hand, since the time resolution of the conventional time counting circuit is determined by the signal delay time for each of the delay circuits composing the inverter, it is necessary to reduce the signal delay time per delay circuit in order to further improve the time resolution.

If the number of the delay circuits is reduced to lower power consumption, the time required for one circulation of signal transition is also reduced. If the signal delay time is reduced in order to improve the time resolution, on the other hand, the time required for one circulation of signal transition is also reduced. However, in the case where the time required for one circulation of signal transition is reduced excessively, the counter cannot perform the operation of counting the number of circulations in time.

Thus, the conventional time counting circuit is disadvantageous in that the number of the delay circuits can be reduced only to the extent that the counter reliably performs the operation of counting the number of circulations, which poses limitations to the degree to which power consumption is lowered. In the case of reducing the signal delay time, on the other hand, an improvement in time resolution causes an unfavorable increase in power consumption, since it becomes necessary to increase the number of the delay circuits so as not to excessively reduce the time required for one circulation of signal transition.

The conventional time counting circuit has another problem which will be described below.

In the time counting circuit shown in FIG. 19, a synchronous counter is usually used as a counter 55a for counting the number of circulations of the signal transition around the inverter ring 51. Each flip-flop composing the synchronous counter outputs a signal to be count data and drives a logic gate in the counter. Since the input terminal of the logic gate has a capacity, a certain time is necessary for driving a plurality of logic gates by the flip-flop. For this reason, it is necessary to take the time which cannot be ignored in respect of the measurement of the pulse spacing before the count data of the counter 55a becomes definite after the output signal of the last inverter composing the inverter ring 51 changes.

A time of about 5 ns is necessary to make the count data of the counter 55a definite. If a signal delay time per inverter is 1 ns, a row of FFs 55b connected to the counter 55a holds false count data when a pulse signal to be measured rises among the 1st to 5th inverters. The reason is that the count data of the counter 55a is not definite when the signal transition exists among the 1st to 5th inverters. As a result, an error occurs in the time data outputted from the time counting circuit. Thus, there is a possibility that the error occurs in the time data depending on the rising timing of the pulse signal to be measured.

SUMMARY OF THE INVENTION

It is therefore an object of the present invention to provide a high-accuracy, low-power time counting circuit.

To overcome the problems mentioned above, a time counting circuit according to the present invention comprises: a delay circuit ring composed of delay circuits having identical structures, the above time counting circuit having the function of correcting numeric data obtained from an output signal from the above delay circuit ring so as to facilitate operation for time data. The arrangement equalizes signal delay times for the respective delay circuits in the time counting circuit, so that accuracy of time measurement is improved and operation for time data is performed as easily as is performed by a conventional time counting circuit.

Alternatively, the time counting circuit according to the present invention comprises: a delay circuit ring composed of a plurality of delay circuits around which signal transition is caused to circulate by oscillation; and a plurality of counter circuits for counting the numbers of signal transitions at respective output terminals of the delay circuits composing the above delay circuit ring, wherein one of the above plurality of counter circuits is selected based on a current position of signal transition in the above delay circuit ring so as to provide the number of circulations of signal transition around the above delay circuit ring based on count data from the selected counter circuit. The arrangement prevents the occurrence of an error in circulation number data, resulting in improved accuracy of time measurement.

Alternatively, the time counting circuit according to the present invention comprises: a delay circuit ring composed of a plurality of delay circuits around which signal transition is caused to circulate by oscillation; and plural rows of holding circuits each composed of a plurality of holding circuits connected to respective output terminals of the delay circuits composing the above delay circuit ring, the above rows of holding circuits outputting signals at the output terminals of the delay circuits to which the respective holding circuits are connected on a rising edge of an inputted pulse signal, wherein each row of holding circuits receive a pulse signal to be measured and other pulse signals having respective time differences with the pulse signal to be measured, the above time counting circuit providing time data based on the signals outputted from the respective rows of holding circuits. The arrangement improves time resolution without reducing the signal delay time for each of the delay circuits.

Alternatively, the time counting circuit according to the present invention comprises: a delay circuit ring composed of a plurality of delay circuits around which signal transition is caused to circulate by oscillation; and a counter circuit for counting the number of signal transitions at an output terminal of one of the delay circuits composing the above delay circuit ring as the number of circulations of signal transition around the above delay circuit ring, wherein the above counter circuit has a plurality of counters so as to generate, based on a signal at the output terminal of the above one delay circuit, a plurality of signals having periods longer than a period of the above signal and respective time differences with the above signal, to count transitions of the generated signals by means of the respective counters, and to provide the number of circulations of signal transition around the above delay circuit ring based on count data from each of the counters. The arrangement lessens requirements on time for one circulation of signal transition around the delay circuit ring.

Alternatively, the time counting circuit according to the present invention comprises a row of holding circuits for holding the count data of a counter for counting the number of circulations of the signal transition with a timing which is different from that of the carry of the count data wherein data held in the row of holding circuits are selected when the pulse signal to be measured rises while the count data of the counter is indefinite, and the selected data are corrected to obtain the number of circulations of the signal transition. Thus, an error can be prevented from occurring in time data.

Furthermore, the time counting circuit according to the present invention lowers the frequency of a signal for counting the number of circulations of the signal transition to perform counting by the counter, and sets the count data to the upper bits of the number of circulations of the signal transition, and obtains the lower bits based on the logic level of an original signal. Thus, an error can be prevented from occurring in the time data.

BRIEF DESCRIPTION OF THE DRAWINGS

FIG. 2 shows an output signal from an inverter ring 11, an input signal to an encoder 13b, and output data from the encoder 13b in each time;

FIG. 3 shows time data obtained as a result of data correction performed by a time-difference operating circuit 14;

FIGS. 9a and 9b illustrate a method of operation for time data in the time counting circuit according to the third embodiment of the present invention, of which FIG. 9(a) shows different timing for first to fourth pulses and FIG. 9(b) shows a method of judging time data;

FIG. 19 shows the structure of a conventional time counting circuit.

DETAILED DESCRIPTION OF THE INVENTION

Below, a time counting circuit according to each embodiment of the present invention will be described with reference to the drawings.

(First Embodiment)

Figure 1:
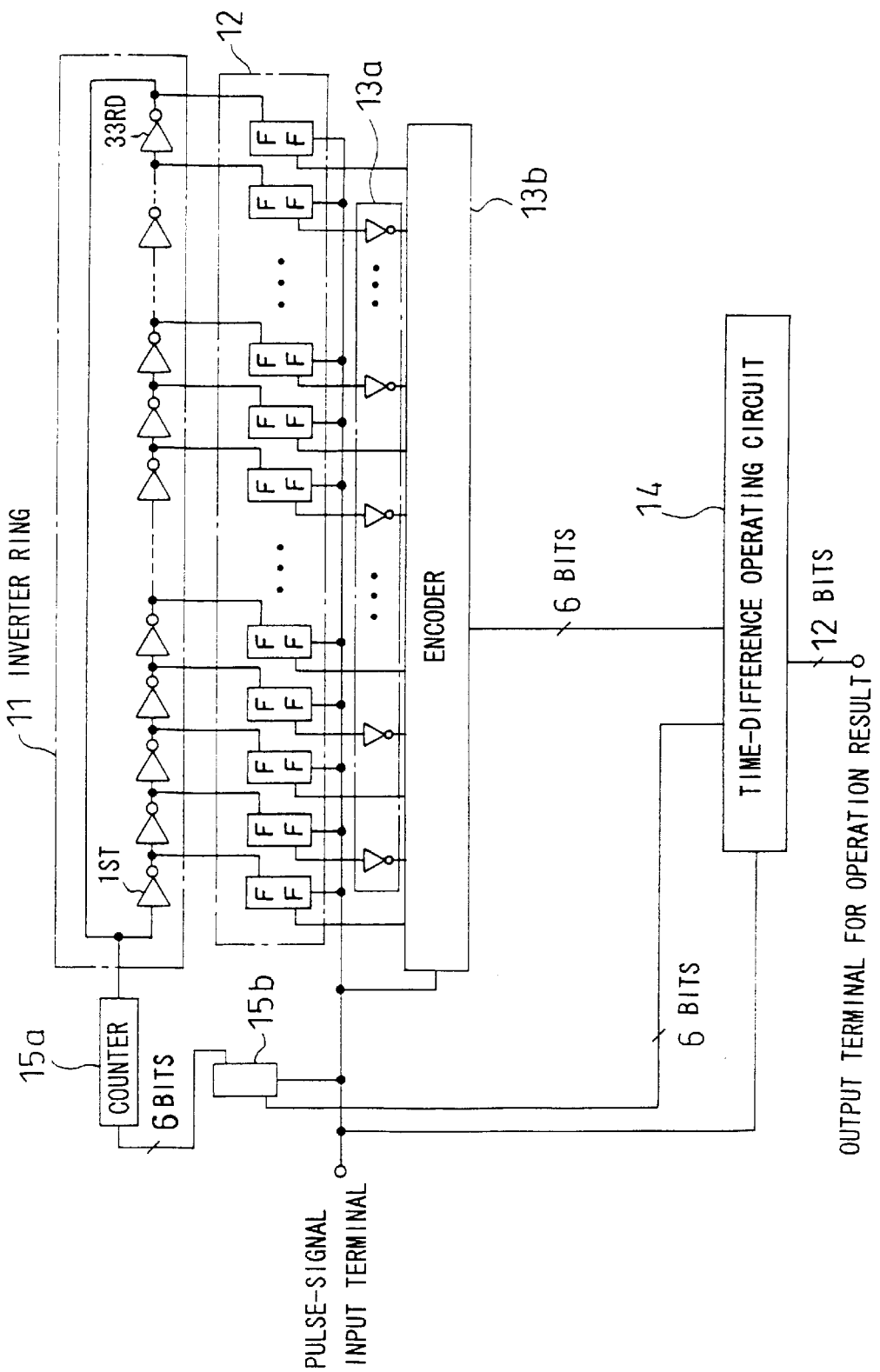
FIG. 1 shows the structure of a time counting circuit according to a first embodiment of the present invention.

FIG. 1 shows the structure of a time counting circuit according to a first embodiment of the present invention, in which are shown: an inverter ring (IR) 11 as a delay circuit ring; a row of holding circuits 12; a row of inverting circuits 13a; an encoder 13b; a time-difference operating circuit 14; a counter 15a; and a counter-output holding circuit 15b. The row of inverting circuits 13a and the encoder 13b constitute signal converting means, while the counter 15a and the counter-output holding circuit 15b constitute a counter circuit. A pulse-signal input terminal receives a pulse signal to be measured, while an operation-result output terminal outputs time corresponding to the pulse spacing of the inputted pulse signal.

The inverter ring 11 consists of 33 (=$2^5$+1) inverters having equal signal delay times, which are connected in a ring. Specifically, the 1st to 33rd inverters are connected in series and an output terminal of the 33rd inverter is connected to an input terminal of the 1st inverter. The row of holding circuits 12 consist of thirty-three flip-flops (FFs) connected to the respective output terminals of all the inverters composing the inverter ring 11, which indicates that each delay circuit is implemented by one inverter. To each of the flip-flops is inputted the pulse signal to be measured.

The row of inverting circuits 13a consist of sixteen inverting circuits connected to respective output signal lines of the flip-flops connected to the even-numbered inverters of the inverter ring 11. The encoder 13b receives output signals directly from these ones of the flip-flops constituting the row of holding circuits 12 which are connected to the odd-numbered inverters of the inverter ring 11, while receiving output signals from the flip-flops connected to the even-numbered inverters via the inverting circuits constituting the row of inverting circuits 13a, and outputs 6-bit numeric data.

The counter 15a is connected to the output terminal of the 33rd inverter (input terminal of the 1st inverter) of the inverter ring 11. The counter-output holding circuit 15b holds the 6-bit count data outputted from the counter 15a.

The time-difference operating circuit 14 receives the 6-bit numeric data outputted from the encoder 13b and 6-bit count data outputted from the counter-output holding circuit 15b and outputs 12-bit time data.

Referring now to FIGS. 2 and 3, a detailed description will be given to the operation of the time counting circuit shown in FIG. 1.

Each of the inverters constituting the inverter ring 11 inverts an input signal and outputs the inverted input signal after a given delay time has elapsed. Since the odd number of inverters are connected in a ring, so-called oscillation is observed whereby one signal transition occurs after another as though seemingly moving along the inverter ring 11 with the passage of time, resulting in circulations around the inverter ring 11.

FIG. 2 shows the transition of an output signal from the inverter ring 11 with the passage of time and an input signal to the encoder 13b and output data therefrom when a pulse signal to be measured rises during each time. In the drawing, the HIGH and LOW levels of the output signal from the inverter and of the input signal to the encoder 13b are represented by "1" and "0", respectively. An increment of time represents a signal delay time for one inverter, which is assumed to be 1 ns.

Here (TIME 0), it is assumed that the output voltages from all the odd-numbered inverters are on the LOW level and that the output voltages from all the even-numbered inverters are on the HIGH level. In this case, only the output voltages from the 33rd and 1st inverters are observed consecutively on the same level. When 1 ns has elapsed (TIME 1), the output voltage from the 1st inverter shifts from the LOW level to the HIGH level since the input voltage thereto (i.e., the output voltage from the 33rd inverter) is on the LOW level. The output voltages from the other odd-numbered inverters remain on the LOW level, while the output voltages from the even-numbered inverters remain on the HIGH level. In this case, only the output voltages from the 1st and 2nd inverters are observed consecutively on the same level.

When another 1 ns has elapsed (TIME 2), the output voltage from the 2nd inverter shifts from the HIGH level to the LOW level since the input voltage thereto (i.e., the output voltage from the 1st inverter) is on the HIGH level. The output voltages from the other even-numbered inverters and the output voltage from the 1st inverter remain on the HIGH level, while the output voltages from the odd-numbered inverters other than the 1st inverter remain on the LOW level. In this case, only the output voltages from the 2nd and 3rd inverters are observed consecutively on the same level. In this manner, signal transition proceeds by one inverter every time 1 ns has elapsed.

Each of the flip-flops constituting the row of holding circuits 12 holds a signal at the output terminal of each of the inverters composing the inverter ring 11. When the pulse signal to be measured rises, each flip-flop outputs the signal held therein at the same time. The flip-flops connected to the odd-numbered inverters output signals directly to the encoder 13b. The flip-flops connected to the even-numbered inverters output signals to the inverting circuits constituting the row of inverting circuits 13a, which invert the input signals and output the inverted input signals to the encoder 13b.

The input signals to the encoder 13b on the rising edge of the pulse signal to be measured are as shown in the middle column of FIG. 2. If the pulse signal rises during TIME 0, for example, all the input signals are on the LOW level. If the pulse signal rises during TIME 1, only the first input signal is on the HIGH level and the other input signals are on the LOW level. The encoder 13b outputs, based on the input signals, the 6-bit data representing 33 tones from "000000" to "100000" (hereinafter referred to as lower-bit data) as shown in the rightmost column of FIG. 2.

The counter 15a counts the number of signal transitions at the output terminal of the 33rd inverter. When signal transition has made one circulation around the inverter ring 11 (TIME 33), the output voltage from the 33rd inverter shifts from the LOW level to the HIGH level, so that the counter 15a adds 1 to the count data. The counter-output holding circuit 15b holds the 6-bit data outputted from the counter 15a and outputs the 6-bit data held therein (hereinafter referred to as upper-bit data) on the rising edge of the pulse signal to be measured.

The lower-bit data outputted from the encoder 13b represents the current position of signal transition in the inverter ring 11 and the upper-bit data outputted from the counter 15a represents the number of circulations of signal transition. Hence, the time data representing the time at which the pulse signal to be measured rises can be obtained from the above two sets of data.

However, the lower-bit data merely combined with the upper-bit data cannot form the 12-bit time data. This is because, since the lower-bit data is represented by values from "000000" to "100000", the lower-bit data merely combined with the upper-bit data form discontinuous time data. To facilitate the calculation of time difference, the time data is required to be continuous, so that some type of data correction becomes necessary, which is performed by the time-difference operating circuit 14.

FIG. 3 shows time data obtained through data correction performed by the time-difference operating circuit 14. A description will be given below to the method of data correction. First, values equal to those of the upper-bit data outputted from the counter 15a are defined as addition values. The addition values are added to the lower-bit data outputted from the encoder 13b. The upper-bit data is further multiplied by $2^5$ (five bits of "0" are connected to the least significant bit of the upper-bit data) and the result of the addition previously performed is added thereto. The 12-bit data thus obtained through the operation is defined as the time data.

It will be appreciated from FIG. 3 that the time data representing continuous 2112 (33 stages×$2^6$) tones can be provided by the time counting circuit according to the present embodiment. The pulse spacing can be measured using the time data in the same manner as measured by the conventional time counting circuit.

Since the data correction performed by the time-difference operating circuit 14 can be performed through the addition and multiplication by some power-of-2 number, it can be implemented by a circuit extremely small in size.

(Second Embodiment)

Figure 4:
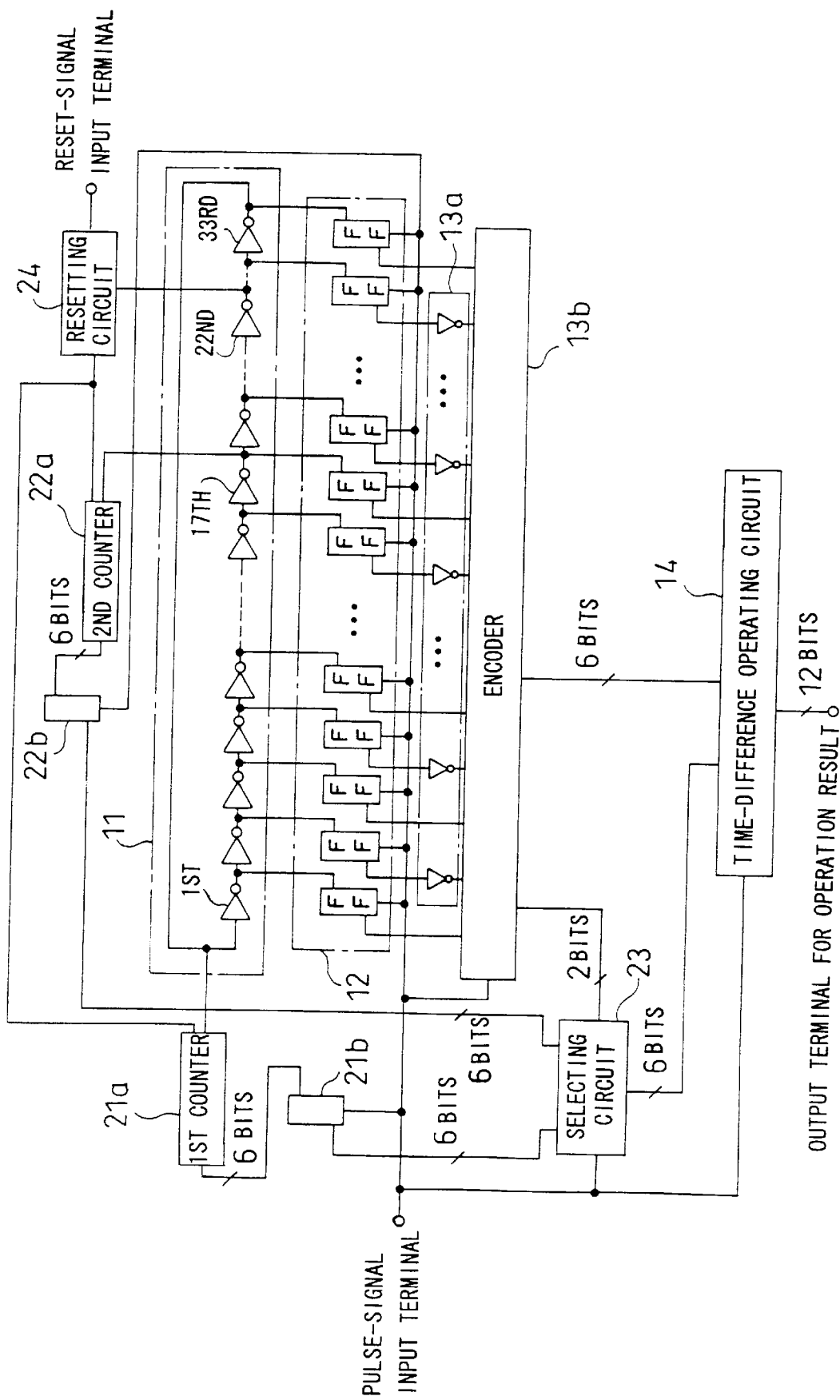
FIG. 4 shows the structure of a time counting circuit according to a second embodiment of the present invention.

FIG. 4 shows the structure of a time counting circuit according to a second embodiment of the present invention, in which are shown: an inverter ring (IR) 11 as a delay circuit ring; a row of holding circuits 12; a row of inverting circuits 13a; an encoder 13b; a time-difference operating circuit 14; a first counter 21a; a first-counter-output holding circuit 21b; a second counter 22a; a second-counter-output holding circuit 22b; a selecting circuit 23; and a resetting circuit 24. The row of inverting circuits 13a and the encoder 13b constitute signal converting means. The first counter 21a and the first-counter-output holding circuit 21b constitute a first counter circuit (first counting portion), while the second counter 22a and the second-counter-output holding circuit 22b constitute a second counter circuit (second counting portion). A pulse-signal input terminal receives a pulse signal to be measured. An operation-result output terminal outputs time corresponding to the pulse spacing of the inputted pulse signal. A reset-signal input terminal receives a reset signal for resetting the first and second counters 21a and 22a.

As for the inverter ring (IR) 11, row of holding circuits 12, row of inverting circuits 13a, and time-difference operating circuit 14, they operate in the same manner as in the time counting circuit according to the first embodiment, so that the description thereof is omitted in the present embodiment.

The encoder 13b operates in the same manner as in the first embodiment in that it outputs 6-bit lower-bit data based on an input signal. In addition, the encoder 13b outputs a 2-bit select signal which will be described later.

The first counter 21a is connected to the output terminal of the 33rd inverter (input terminal of the 1st inverter) of the inverter ring 11. The first-counter-output holding circuit 21b holds 6-bit count data outputted from the first counter 21a.

The second counter 22a is connected to the output terminal of the 17th inverter (input terminal of the 18th inverter) of the inverter ring 11. The second-counter-output holding circuit 22b holds 6-bit count data outputted from the second counter 22a.

The selecting circuit 23 selects, based on the 2-bit select signal outputted from the encoder 13b, either one of the 6-bit count data outputted from the first-counter-output holding circuit 21b and the 6-bit count data outputted from the second-counter-output holding circuit 22b and outputs the selected one as the upper-bit data to the time-difference operating circuit 14.

The resetting circuit 24 is connected to the output terminal of the 22nd inverter (input terminal of the 23rd inverter) of the inverter ring 11 and outputs, based on the reset signal received from the outside, a signal for resetting the counts of the first and second counters 21a and 22a.

Figure 5:
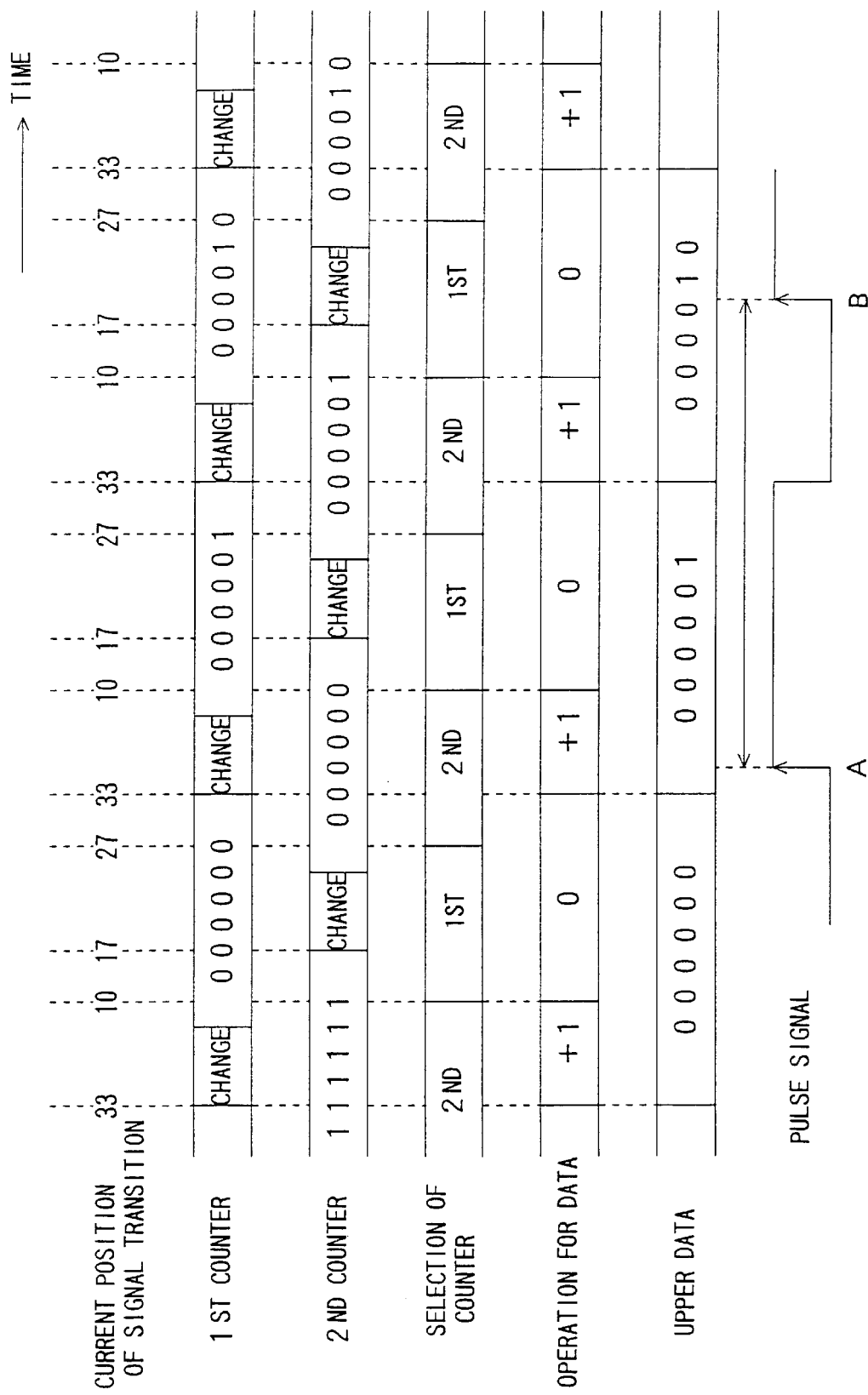
FIG. 5 illustrates the operations of first and second counters and of a selecting circuit in the time counting circuit according to the second embodiment of the present invention.
Figure 6:
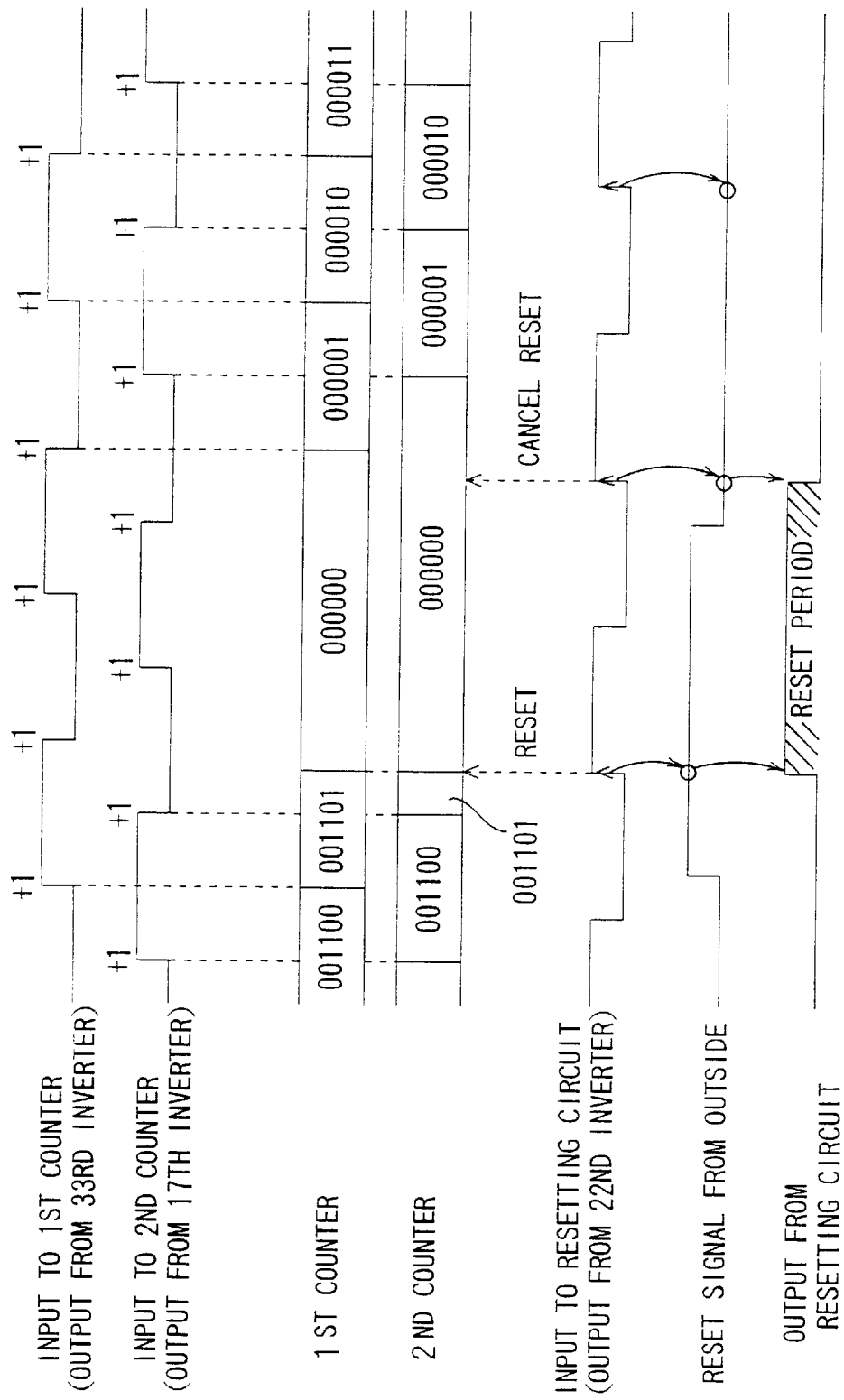
FIG. 6 illustrates the operation of a resetting circuit in the time counting circuit according to the second embodiment of the present invention.

Referring now to FIGS. 5 and 6, a detailed description will be given to the operation of the time counting circuit shown in FIG. 4.

FIG. 5 illustrates the operations of the first and second counters 21a and 22a and of the selecting circuit 23.

First, the first counter 21a initiates adding operation when the output signal from the 33rd inverter changes and generates stabilized output data after a given period of time has elapsed. The second counter 22a initiates adding operation when the output signal from the 17th inverter changes and generates stabilized output data after a given period of time has elapsed.

Of the two bits in the select signal outputted from the encoder 13b, the lower bit is a signal directing selection between the counters and the upper bit is a signal indicating whether or not the count data from the selected counter should be corrected. The selecting circuit 23 selects, based on the lower bit of the select signal, that one of the counters which generates more stabilized output data. To avoid malfunction due to a mishold in the row of holding circuits 12, the first counter 21a is selected when signal transition is occurring at any one of the output terminals of the 10th to 27th inverters in the inverter ring 11, while the second counter 22a is selected in the other cases.

A description will be given to the mishold in the row of holding circuits 12.

A flip-flop is a circuit which holds an input signal in the form of a so-called logic voltage of "0" or "1". Even if the input signal has an intermediate value between "0" and "1", either one of the logic voltages is held in the flip-flop. There may be cases where each of the probability of holding "0" and the probability of holding "1" has a finite value depending on the level of the input signal. Here, the range of such a signal level is termed an indefinite region.

A signal transition from "0" to "1" or "1" to "0" at the output terminal of each of the inverters composing the inverter ring 11 requires a given period of time. The timing with which the pulse signal to be measured rises is irrelevant to the signal transition at the output terminal of each inverter. Consequently, when the pulse signal to be measured rises and each of the flip-flops constituting the row of holding circuits 12 initiates holding operation, there may be cases where the level of the signal at the output terminal of the inverter falls within the indefinite region, so that an error may occur in the reading of the current position of signal transition.

When the signals at the output terminals of the 1st to 5th inverters shift from "01010" (TIME 0) to "11010" (TIME 1), for example, if the pulse signal to be measured rises while the levels of the signals at the output terminals of the 1st and 2nd inverters fall within the indefinite region, there is a given probability that the row of holding circuits 12 output "00010", which is termed a mishold. Although the encoder 13b corrects the data in that case, an error on the order of 4 to 5 ns may occur, if the delay time for one inverter is 1 ns, in the total delay time for several inverters.

The selecting circuit 23 is designed to switch between the counters at a time sufficiently before each counter initiates adding operation so that the counter which generates more stabilized output data can be selected even when a mishold occurs in the row of holding circuits 12.

When signal transition is currently occurring at any of the output terminals of the 33rd to 10th inverters, the selecting circuit 23 selects the second counter 22a and adds 1 to the count data based on the upper bit of the select signal. This is because the count data should be corrected since counting by the second counter 22a lags behind counting by the first counter 21a.

A description will be given to specific operations of the selecting circuit 23 and time-difference operating circuit 14 with reference to the case where the pulse spacing of a pulse signal shown in FIG. 5 is calculated. On the rising edge A, the current position of signal transition has assumedly reached the output terminal of the 2nd inverter and "000010" is outputted as the lower-bit data from the encoder 13b. On the rising edge B, the current position of signal transition has assumedly reached the output terminal of the 19th inverter and "010011" is outputted as the lower-bit data from the encoder 13b.

On the rising edge A, the second counter 22a is selected and 1 is added to the count data in the selecting circuit 23. As a result, "000001" is outputted as the upper-bit data to the time-difference operating circuit 14. On the rising edge B, the first counter 21a is selected and nothing is added to the count data. As a result, "000010" is outputted as the upper-bit data to the time-difference operating circuit 14.

The time-difference operating circuit 14 provides time data in the same manner as in the first embodiment. The time data on the rising edge A becomes "0,000001,00011", while the time data on the rising edge B becomes "0,000010, 10101". The time difference becomes "0,000001,10010"=50 (decimal number), so that a pulse spacing of 50 ns is provided if the signal delay time for one inverter is assumed to be 1 ns.

The resetting circuit 24 operates consistently on the precondition that counting by the first counter 21a precedes counting by the second counter 22a irrespective of the timing with which a reset signal is inputted thereto.

FIG. 6 illustrates the operation of the resetting circuit 24.

The first counter 21a counts the changing of an output signal from the 33nd inverter, while the second counter 22a counts the changing of an output signal from the 17th inverter. The resetting circuit 24 receives an output signal from the 22nd inverter.

When the output signal from the 22nd inverter rises, the resetting circuit 24 examines whether the reset signal from the outside is on the HIGH or LOW level. If the reset signal is on the HIGH level, the resetting circuit 24 generates an output signal on the HIGH level to the counter. If the reset signal is on the LOW level, on the other hand, the resetting circuit 24 generates an output signal on the LOW level to the counter.

When the output signal from the resetting circuit 24 rises, the first and second counters 21a and 22a are reset so that the output data from each of the counters becomes "000000". When the output signal from the resetting circuit 24 falls, the resetting is cancelled so that the first and second counters 21a and 22a start counting again. Since the timing with which the resetting is cancelled coincides with the timing with which the output signal from the 22nd inverter rises, the first counter 21a invariably starts counting ahead of the second counter 22a. Consequently, counting by the first counter 21a precedes counting by the second counter 22a irrespective of the timing with which the reset signal is inputted from the outside.

Figure 7:
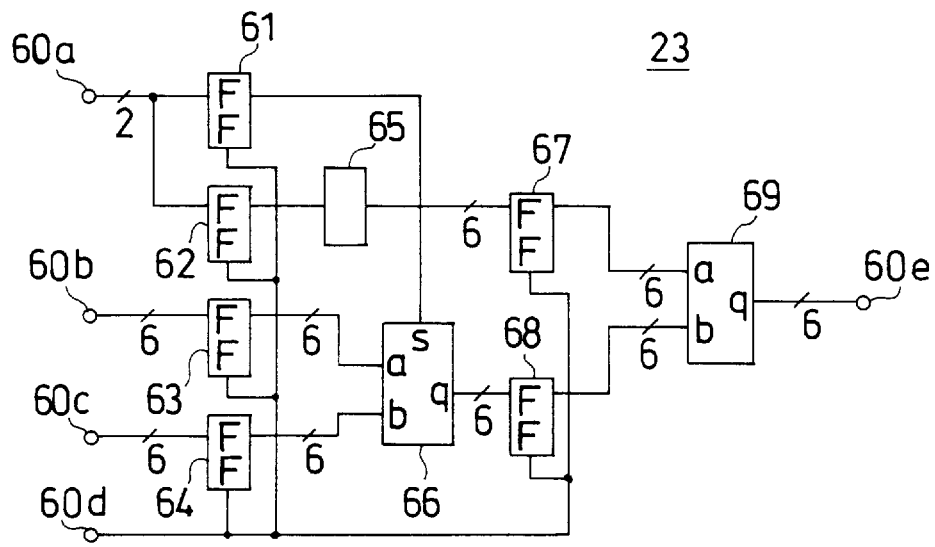
FIGS. 7a and 7b are circuit diagrams is a circuit diagram showing the internal structures of the selecting circuit 23 and of the time-difference operating circuit 14 in the time counting circuit shown in FIG. 4.
Figure 7:
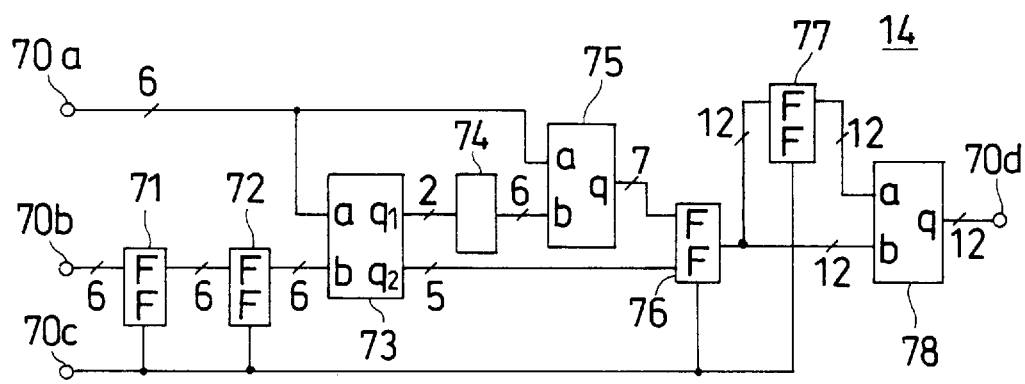

FIGS. 7(a) and 7(b) are circuit diagrams showing respective internal structures of the selecting circuit 23 and time-difference operating circuit 14 in the time counting circuit shown in FIG. 4.

In FIG. 7(a) are shown: an input terminal 60a for receiving the select signal outputted from the encoder 13b; an input terminal 60b for receiving the 6-bit count data outputted from the first-counter-output holding circuit 21b; an input terminal 60c for receiving the 6-bit count data outputted from the second-counter-output holding circuit 22b; an input terminal 60d for receiving the pulse signal to be measured; and an output terminal 60e from which the count data is outputted.

In the drawing are also shown: 1-bit flip-flops 61 and 62; and 6-bit flip-flops 63, 64, 67, and 68. Of the 2-bit select signal received by the input terminal 60a, the lower bit directing selection between the counters is inputted to the flip-flop 61, while the upper bit indicating whether or not the count data should be corrected is inputted to the flip-flop 62. A data converting circuit 65 outputs 6-bit data in which the least significant bit is occupied by the inputted 1-bit data and the upper 5 bits are "0". A selector circuit 66 selectively outputs either the output data from the flip-flop 63 or the output data from the flip-flop 64 based on the output signal from the flip-flop 61. An adder 69 adds up the output data from the flip-flop 67 and the output data from the flip-flop 68 and outputs the lower 6 bits of the addition result.

In FIG. 7(b) are shown: an input terminal 70a for receiving the count data outputted from the output terminal 60e of the selecting circuit 23; an input terminal 70b for receiving the 6-bit data outputted from the encoder 15b; an input terminal 70c for receiving the pulse signal to be measured; and an output terminal 70d from which data on the operation result is outputted. In the drawing are also shown: 6-bit flip-flops 71 and 72; an adder 73 for adding up the two sets of inputted 6-bit data to obtain 7-bit data and outputting the upper 2 bits of the 7-bit data and the lower 5 bits thereof separately; a data converting circuit 74 for outputting 6-bit data in which the lower 2 bits are occupied by the inputted 2-bit data and the upper 4 bits are "0"; an adder 75 for adding up the two sets of inputted 6-bit data to output 7-bit data; a flip-flop 76 for outputting 12-bit data in which the upper 7 bits are occupied by the inputted 7-bit data and the lower 5 bits are occupied by the inputted 5-bit data; a 12-bit flip-flop 77; and a subtracter 78 for calculating the absolute value of a difference between the two sets of inputted 12-bit data.

A description will be given to the operations of the selecting circuit 23 and of the time-difference operating circuit 14. It is assumed here that the current position of signal transition is in the 32nd inverter of the inverter ring 11 and that the number of circulations of signal transition around the inverter ring 11 is 1 (corresponding to TIME 64 in FIG. 3).

When the current position of signal transition is in the 32nd inverter, the output data from the encoder 13 is "011111", which is inputted to the input terminal 70b of the time-difference operating circuit 14. The 2-bit select signal outputted from the encoder 13b is inputted to the input terminal 60a of the selecting circuit 23. As shown in FIG. 5, if the current position of signal transition is in the 32nd inverter, the second counter 22a is selected and the count data is not corrected. Consequently, the lower bit of the select signal is "1" and the upper bit thereof is "0" (the lower bit of the select signal is "1" when the second counter 22a is selected and "0" when the first counter 21a is selected. The upper bit of the select signal is "1" when the count data is corrected and "0" when the count data is not corrected).

To the input terminal 60b of the selecting circuit 23 is inputted the count data "000001" from the first counter 21a. To the input terminal 60c thereof is inputted the count data "000001" from the second counter 22a. The selector circuit 66 selectively outputs the count data "000001" from the second counter 22a based on the lower bit of the select signal. The adder 69 adds up corrected 6-bit data "000000" obtained through conversion by the data converting circuit 65 and the count data "000001" selectively outputted from the selector circuit 66 and outputs 6-bit data "000001" obtained through the addition, which is outputted from the output terminal 60e.

The data outputted from the output terminal 60e of the selecting circuit 23 is inputted to the input terminal 70a of the time-difference operating circuit 14. The adder 73 adds up the data "000001" inputted to the input terminal 70a and the output data "011111" from the encoder 13b which has been inputted to the input terminal 70b. The addition result obtained is "0100000", of which the upper 2 bits "01" are outputted from an output terminal $q_1$ and the lower 5 bits "00000" are outputted from an output terminal $q_2$. The adder 75 adds up the upper data of the addition result which has been converted to 6-bit data "000001" by the data convert-ing circuit 74 and the data "000001" inputted to the input terminal 70a and outputs 7-bit data "0000010" obtained through the addition.

The flip-flop 76 outputs 12-bit data "000001000000" in which the upper 7 bits are occupied by the 7-bit data outputted from the adder 75 and the lower 5 bits are occupied by the 5-bit data outputted from the output terminal $q_2$ of the adder 73. The 12-bit data obtained coincides with the time data shown in FIG. 3. The difference between the two sets of time data, i.e., data on the time difference representing the pulse spacing is provided by the subtracter 78 and outputted from the output terminal 70d.

Thus, according to the present embodiment, the provision of the two counter circuits eliminates a mishold in the counter-output holding circuit, so that the occurrence of an error in the upper-bit data of the time data can be prevented.

Although the present embodiment has used the two counter circuits, additional counter circuits may be provided in accordance with the number of the inverters included in the inverter ring. The time counting circuit in the present embodiment, which has been obtained by adding a plurality counter circuits to the time counting circuit in the first embodiment, can also be applied to a conventional time counting circuit.

According to the present embodiment, high-accuracy time data can be obtained even in a time counting circuit wherein the delay time for one delay circuit is 1 ns or less, the application of which is being examined by the present inventors.

(Third Embodiment)

Figure 8:
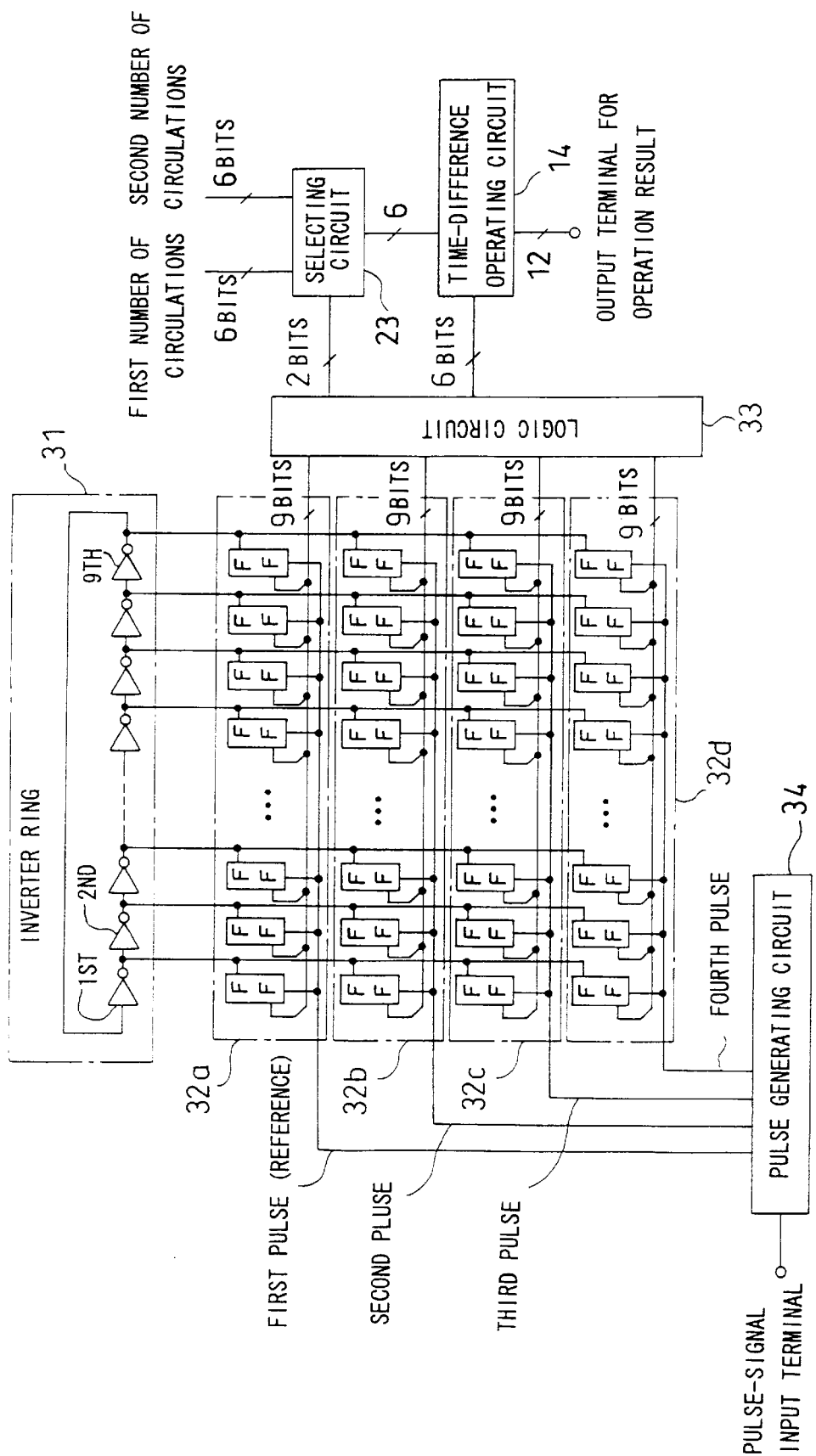
FIG. 8 shows the structure of a time counting circuit according to a third embodiment of the present invention.

FIG. 8 partially shows the structure of a time counting circuit according to a third embodiment of the present invention. In the drawing are shown: an inverter ring (IR) 31 as a delay circuit ring; a row of reference holding circuits 32a; a first row of subordinate holding circuits 32b; a second row of subordinate holding circuits 32c; a third row of subordinate holding circuits 32d; a logic circuit 33 as a signal converting means; and a pulse generating circuit 34. The selecting circuit 23 and time-difference operating circuit 14 have the same structures as shown in FIG. 4. The pulse-signal input terminal receives a pulse signal to be measured. The operation-result output terminal outputs time corresponding to the pulse spacing of the inputted pulse signal. The counter circuit and resetting circuit are not shown in the drawing.

The inverter ring 31 has substantially the same structure as the inverter ring 11 shown in FIGS. 1 and 4 except that the inverter ring 31 is composed of nine inverters. Each of the row of reference holding circuits 32a and the first to third rows of subordinate holding circuits 32b, 32c, and 32d are composed of nine flip-flops (FFs) connected to respective output terminals of all the inverters composing the inverter ring 31.

The logic circuit 33 performs a logic operation based on 9-bit data outputted from each row of holding circuits, outputs the lower-bit data of time data to the time-difference operating circuit 14, while outputting a select signal to the selecting circuit 23. The selecting circuit 23 selects, based on the select signal, either one of first and second numbers of circulations and outputs the selected one as the upper-bit data of the time data to the time-difference operating circuit 14.

The pulse generating circuit 34 outputs, based on the inputted pulse signal to be measured, a first pulse signal as a reference pulse signal and second to fourth pulse signals.

The first pulse signal is inputted to each of the flip-flops composing the row of reference holding circuits 32a. Likewise, the second pulse signal is inputted to each of the flip-flops composing the first row of subordinate holding circuits 32b. The third pulse signal is inputted to the second row of subordinate holding circuits 32c. The fourth pulse signal is inputted to the third row of subordinate holding circuits 32d.

A description will be given below to the operation of the time counting circuit shown in FIG. 8.

Of the four pulse signals outputted from the pulse generating circuit 34, the first pulse signal changes with the same timing with which the inputted pulse signal to be measured changes. The second pulse signal is lagging behind the first pulse signal by $NT_d+T_d/4$. The third pulse signal is lagging behind the first pulse signal by $NT_d+T_d/2$. The fourth pulse signal is lagging behind the first pulse signal by $NT_d+3T_d/4$. Here, N is an integer equal to or more than 1 and $T_d$ is a delay time for one of the inverters composing the inverter ring 31.

Figure 9:
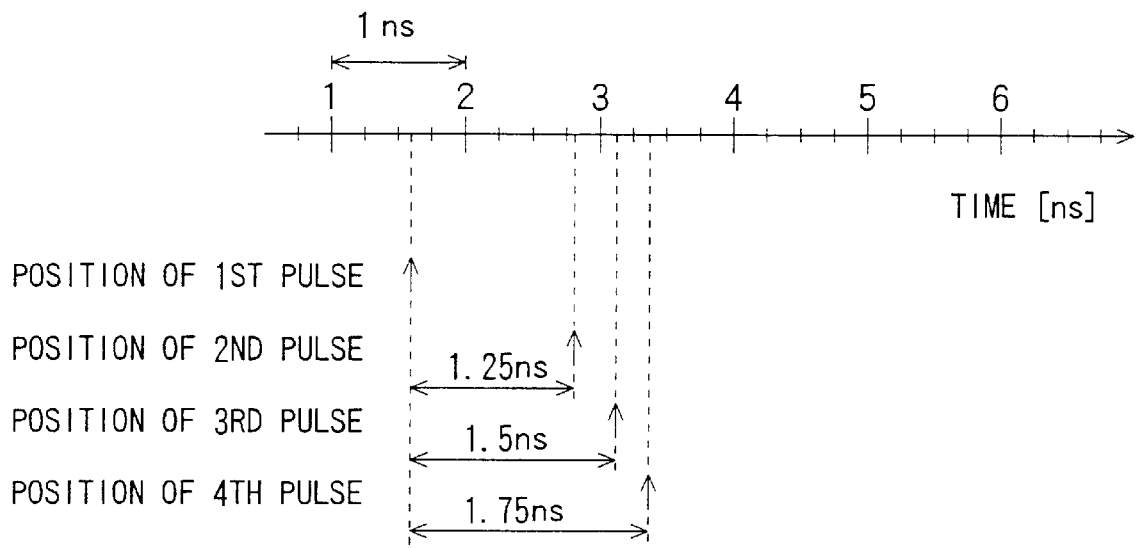

FIG. 9(a) shows differences between timings for the first to fourth pulse signals, in which N=1 and $T_d$=1 ns are satisfied. Specifically, the second pulse signal is delayed by 1.25 ns, the third pulse signal is delayed by 1.5 ns, and the fourth pulse signal is delayed by 1.75 ns.

It is assumed that the first signal rises between 1.5 ns and 1.75 ns. In this case, signals outputted from the row of reference holding circuits 32a represent 1 ns, which indicates that time data according to the first pulse signal is 1 ns. The second pulse signal rises between 2.75 ns and 3.0 ns. The third pulse signal rises between 3.0 ns and 3.25 ns. The fourth pulse signal rises between 3.25 ns and 3.5 ns. Consequently, the time represented by signals outputted from first row of subordinate holding circuits 32b becomes 2 ns, while the time represented by signals outputted from the second and third rows of subordinate holding circuits 32c and 32d becomes 3 ns. Consequently, the time data according to the second pulse signal is 2 ns, while the time data according to the third or fourth pulse signal is 3 ns.

The accuracy of the time data according to the first pulse signal can be increased based on the time data according to the second to fourth pulse signals. FIG. 9(b) illustrates the method of increasing the accuracy of the time data according to the first pulse signal. For example, in the case where all the sets of time data according to the second to fourth pulse signals are smaller than 3 ns, it can be judged that the first pulse signal has risen between 1.0 ns and 1.25 ns, so that the time data according to the first pulse signal is 1.0 ns. On the other hand, in the case where the time data according to the second pulse signal is smaller than 3 ns and the sets of time data according to the third and fourth pulse signals are larger than 3 ns (in the case shown in FIG. 9(a)), it can be judged that the first pulse signal has risen between 1.5 ns and 1.75 ns, so that the time data according to the first pulse signal is 1.5 ns. Such judgement can be made by the logic circuit 33.

Through such operations, time data representing time in increments of 0.25 ns can be provided even when the delay time per inverter is 1 ns. In other words, the time resolution can be quadrupled. Although the number of the inverters included in the inverter ring 31 is nine, the number of bits in the lower-bit data of the time data becomes six similarly to the time counting circuit shown in FIG. 1, since 9×4=36 sets of data can be obtained in one circulation of signal transition around the inverter ring 31.

As described above, according to the present embodiment, time data representing time in a unit smaller than the delay time for one of the inverters composing the inverter ring can be provided. Moreover, since the number of the inverters is by far smaller in the present embodiment than in the conventional time counting circuit, the power consumption of the entire circuit can be reduced significantly.

In the present invention, the number of the rows of holding circuits is not limited to four but a given number of rows of holding circuits can be provided in accordance with the signal delay time for one delay circuit and with the accuracy of time data desired.

(Fourth Embodiment)

Figure 10:
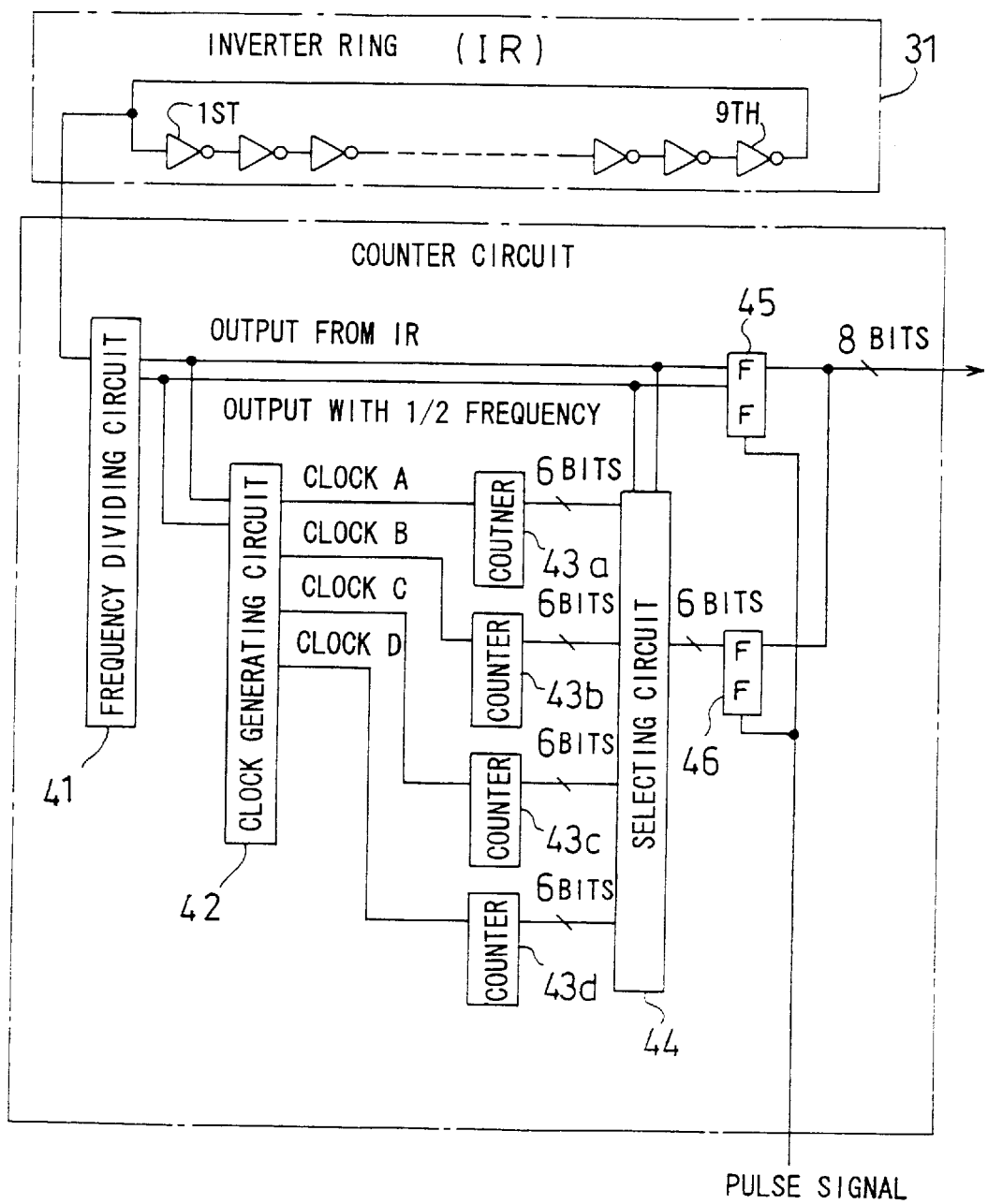
FIG. 10 shows the structure of a counter circuit in a time counting circuit according to a fourth embodiment of the present invention.

FIG. 10 shows the structure of a counter circuit in a time counting circuit according to a fourth embodiment of the present invention, in which are shown: an inverter ring (IR) 31 which is the same as shown in FIG. 8; a frequency dividing circuit 41; a clock generating circuit 42; counters 43a, 43b, 43c, and 43d; a selecting circuit 44; and rows of holding circuits 45 and 46, all of which constitute the counter circuit. The rows of holding circuits 45 and 46 constitute a count-data holding circuit.

Figure 11:
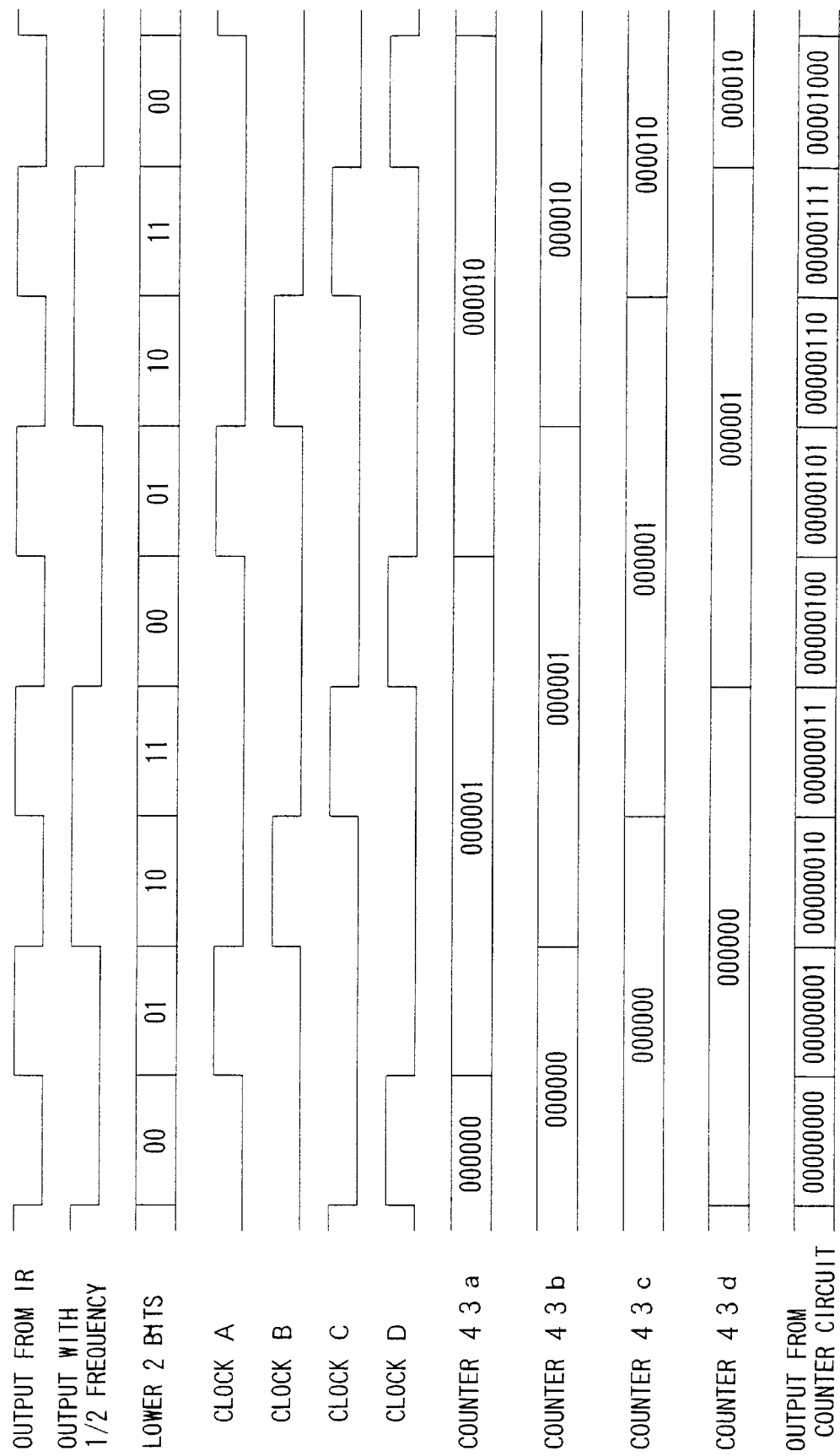
FIG. 11 illustrates the operation of the foregoing counter circuit.

Referring now to FIG. 11, a description will be given to the operation of the counter circuit shown in FIG. 10.

The frequency dividing circuit 41 receives an output signal from the 9th inverter of the inverter ring 31 (hereinafter referred to as an IR output signal) and generates a ½ divided-frequency clock signal having a period double the period of the IR output signal. The frequency dividing circuit 41 also outputs 2-bit data in which the lower bit is occupied by data represented by the IR output signal and the upper bit is occupied by data represented by the ½ divided-frequency clock signal.

The clock generating circuit 42 generates four clock signals as shown in FIG. 11 based on the 2-bit data outputted from the frequency dividing circuit 41. Of the four clock signals, the clock A is a signal which is on the HIGH level only when the 2-bit data is "01", the clock B is a signal which is on the HIGH level only when the 2-bit data is "10", the clock C is a signal which is on the HIGH level only when the 2-bit data is "11", and the clock D is a signal which is on the HIGH level only when the 2-bit data is "00".

The counters 43a, 43b, 43c, and 43d output 6-bit count data, similarly to the counter 15a shown in FIG. 1. The counter 43a counts the number of rising edges of the clock A. The counters 43a, 43b, and 43c counts the numbers of respective rising edges of the clocks A, B, C, and D. Briefly, each of the counters counts once every time the IR output signal makes four transitions, while maintaining specified time differences therewith. The count data from each of the counters is inputted to the selecting circuit 44.

The selecting circuit 44 selects one of the respective sets of count data from the counters based on the 2-bit data outputted from the frequency dividing circuit 41. When the 2-bit data is "00", the count data from the counter 43a is selected. When the 2-bit data is "01", the count data from the counter 43b is selected. When the 2-bit data is "10", the count data from the counter 43c is selected. When the 2-bit data is "11", the count data from the counter 43d is selected.

The count data selected by the selecting circuit 44 is held by the row of holding circuits 46. The 2-bit data outputted from the frequency dividing circuit 41 is held by the row of holding circuits 45. When the pulse signal to be measured received from the outside rises, the counter circuit outputs 8-bit data in which the lower 2 bits are occupied by the 2-bit data held in the row of holding circuits 45 and the upper 6 bits are occupied by the 6-bit data held in the row of holding circuits 46.

Since the number of inverters composing the inverter ring 31 is nine, 4-bit lower-bit data can be obtained. Consequently, 12-bit time data can be provided, similarly to the time counting circuit shown in FIG. 1, which enables time to be counted in 2304 (9 stages×$2^8$) tones.

Thus, the counter circuit in the present embodiment can count clock signals having a period quadruple the period that can be counted by the counter provided therein. By using the counter circuit, circulation number data can be provided with accuracy even when the time required for one circulation of signal transition around the inverter ring of the time counting circuit is reduced.

According to the present embodiment, therefore, it becomes possible to drastically reduce power consumption by reducing the number of inverters, compared with the conventional time counting circuit. Moreover, even if time resolution is to be improved by reducing the signal delay time, it is no more necessary to increase the number of inverters, which prevents an increase in power consumption.

(Fifth Embodiment)

A fifth embodiment of the present invention prevents the error of time data from occurring due to the existence of time for which the count data of a counter for counting the number of circulations of the signal transition around a delay circuit ring is indefinite.

Figure 12:
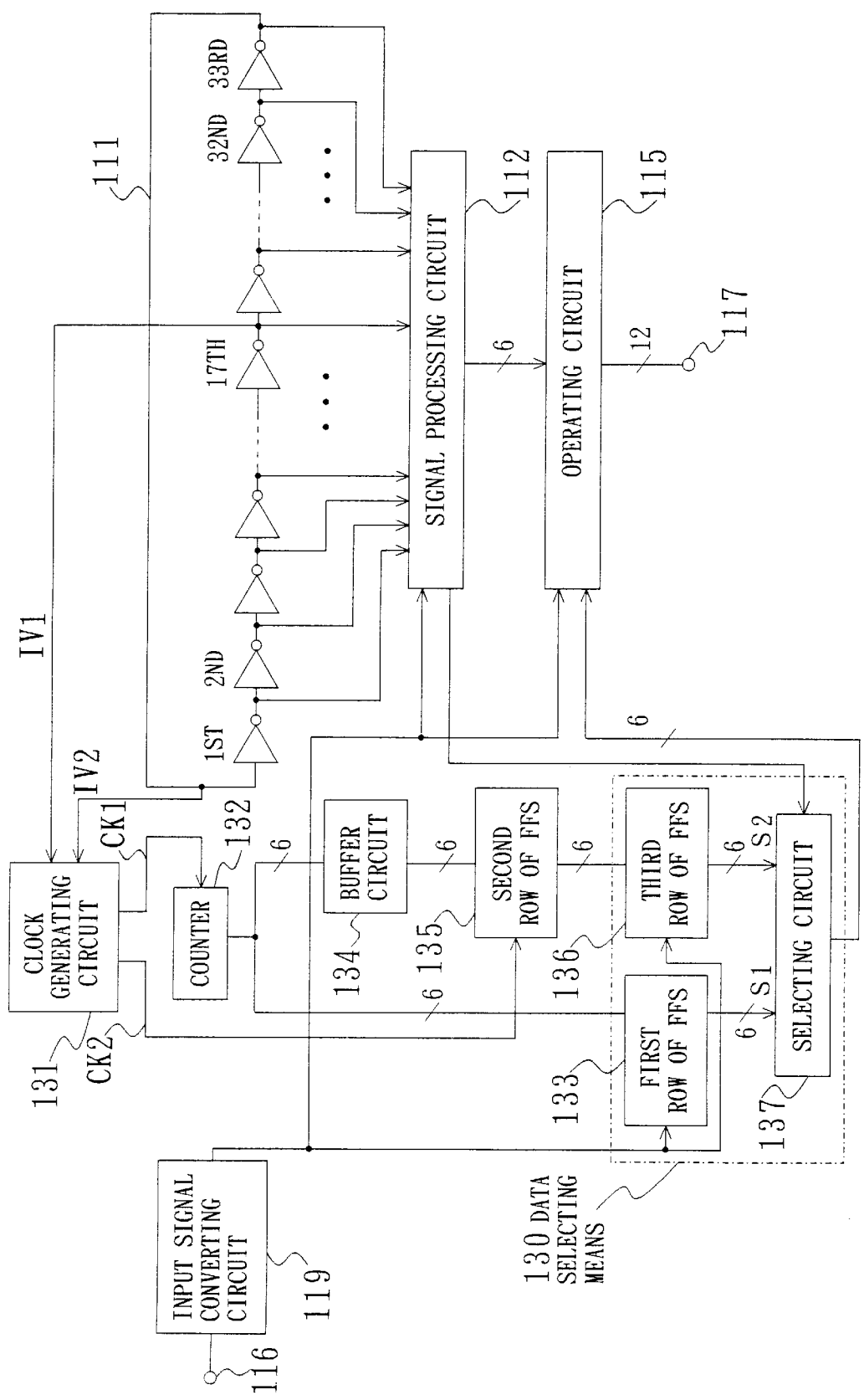
FIG. 12 shows the structure of a time counting circuit according to a fifth embodiment of the present invention.

FIG. 12 is a block diagram showing the structure of a time counting circuit according to the fifth embodiment of the present invention, in which are shown: an inverter ring 111 that acts as a delay circuit ring around which the signal transition circulates; a signal processing circuit 112; an operating circuit 115; a signal input terminal 116; a time data output terminal 117; an input signal converting circuit 119 for converting a signal inputted to the signal input terminal 116 to a pulse signal; a clock generating circuit 131; a counter 132; a first row of FFs 133; a buffer circuit 134; a second row of FFs 135 which acts as holding means; a third row of FFs 136; and a selecting circuit 137. The first row of FFs 133, the third row of FFs 136 and the selecting circuit 137 compose data selecting means 130. The counter 132 composes a first counting portion. The counter 132, the buffer circuit 134 and the second row of FFs 135 compose a second counting portion.

The inverter ring 111 consists of 33 (=$2^5$+1) inverters having equal signal delay times, which are connected in a ring. The 1st to 33rd inverters are connected in series. Moreover, the output terminal of the 33rd inverter is connected to the input terminal of the 1st inverter. Since an odd number of inverters are connected in a ring, the inverter ring 111 oscillates so that the signal transition is caused to circulate. A signal is outputted from each inverter composing the inverter ring 111 to the signal processing circuit 112. For this reason, the inverter ring 111 acts as a delay circuit ring in which each delay circuit is composed of one inverter.

The signal processing circuit 112 includes 33 flip-flops (FF), and a logic circuit. The input terminal of each FF composing the signal processing circuit 112 is connected to the output terminal of each inverter composing the inverter ring 111. Since a pulse signal outputted from the input signal converting circuit 119 is inputted to the clock terminal of each FF, the output signal of each inverter composing the inverter ring 111 is held in each FF when the pulse signal rises. The signal held in each FF is inputted to the logic circuit. The logic circuit performs operation based on the signal held in each FF, and outputs 6-bit numeric data as a result of the operation.

The operating circuit 115 operates 12-bit time data which represents the pulse width of the pulse signal outputted from the input signal converting circuit 119 based on 6-bit numeric data outputted from the signal processing circuit 112 and 6-bit count data outputted from the selecting circuit 137, and outputs the same 12-bit time data.

The clock generating circuit 131 combines signals outputted from the inverter ring 111 to generate a first clock signal CK1 and a second clock signal CK2 having respective timings and to output the same clock signals CK1 and CK2 to the counter 132 and the second row of FFs 135, respectively.

The counter 132 counts the first clock signal CK1 outputted from the clock generating circuit 131.

The first row of FFs 133 holds the count data of the counter 132 with the timing of the rising edge of an FM pulse signal outputted from the input signal converting circuit 119, and outputs the same count data to the selecting circuit 137.

The buffer circuit 134 is provided to prevent the malfunction of the counter 132 such that a noise caused by the holding operation of input data performed by the second row of FFs 135 does not influence the output terminal of the counter 132.

The second row of FFs 135 holds the count data of the counter 132 with the timing of the rising edge of the second clock signal CK2 outputted from the clock generating circuit 131, and outputs the count data to the third row of FFs 136.

The third row of FFs 136 holds the data held in the second row of FFs 135 with the timing of the rising edge of the FM pulse signal outputted from the input signal converting circuit 119, and outputs the same held data to the selecting circuit 137.

The selecting circuit 137 selects either the output signal of the first row of FFs 133 or that of the third row of FFs 136 in accordance with a signal sent from the signal processing circuit 112.

Figure 13:
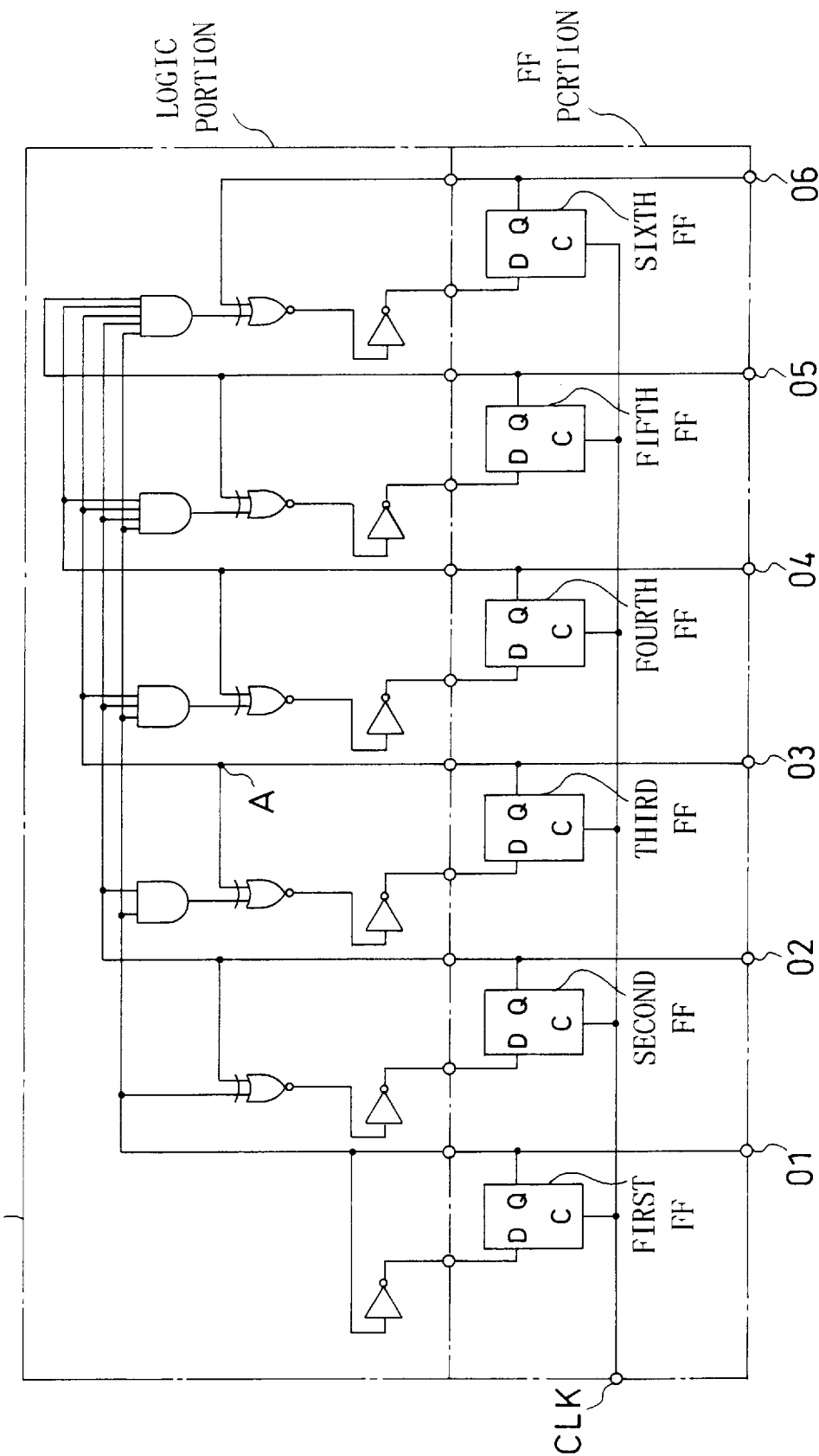
FIG. 13 shows the structure of a 6-bit synchronous counter.

FIG. 13 is a circuit diagram showing the structure of a synchronous 6-bit binary counter which is used as the counter 132. A counter shown in FIG. 13 is composed of a logic portion and a FF portion, and counts the number of the changes of a signal inputted to an input terminal CLK and outputs 6-bit count data which represent the result of count from output terminals O1 to O6.

Each FF composing the FF portion outputs the signal of an input terminal D to an output terminal Q by the edge of the signal inputted to a clock terminal C. The signal of the output terminal Q is outputted to the output terminal of the counter and drives the input terminal of the logic gate composing the logic portion. For example, the signal of the output terminal Q of a first FF is outputted to the output terminal O1 of the counter and drives the input terminals of 6 logic gates. Since the input terminal of the logic gate has a capacity, a certain time is necessary for driving a plurality of logic gates.

There will be considered the case where the count data of the counter is carried from "011111" to "100000". When the signal inputted to the input terminal CLK changes, the output signal of the 6th FF changes most quickly because a load is the smallest during driving. Accordingly, the count data is first set to "111111". Then, the output signal of the 5th FF changes. Consequently, the count data is set to "101111". Thereafter, the count data is sequentially changed to "100111", "100011", "100001" and "100000". Thus, the output data of the counter has various values in the process where the count data is carried by "1". Consequently, it is necessary to take a certain time before the count data of the counter becomes definite after the signal inputted to the input terminal CLK changes.

Figure 14:
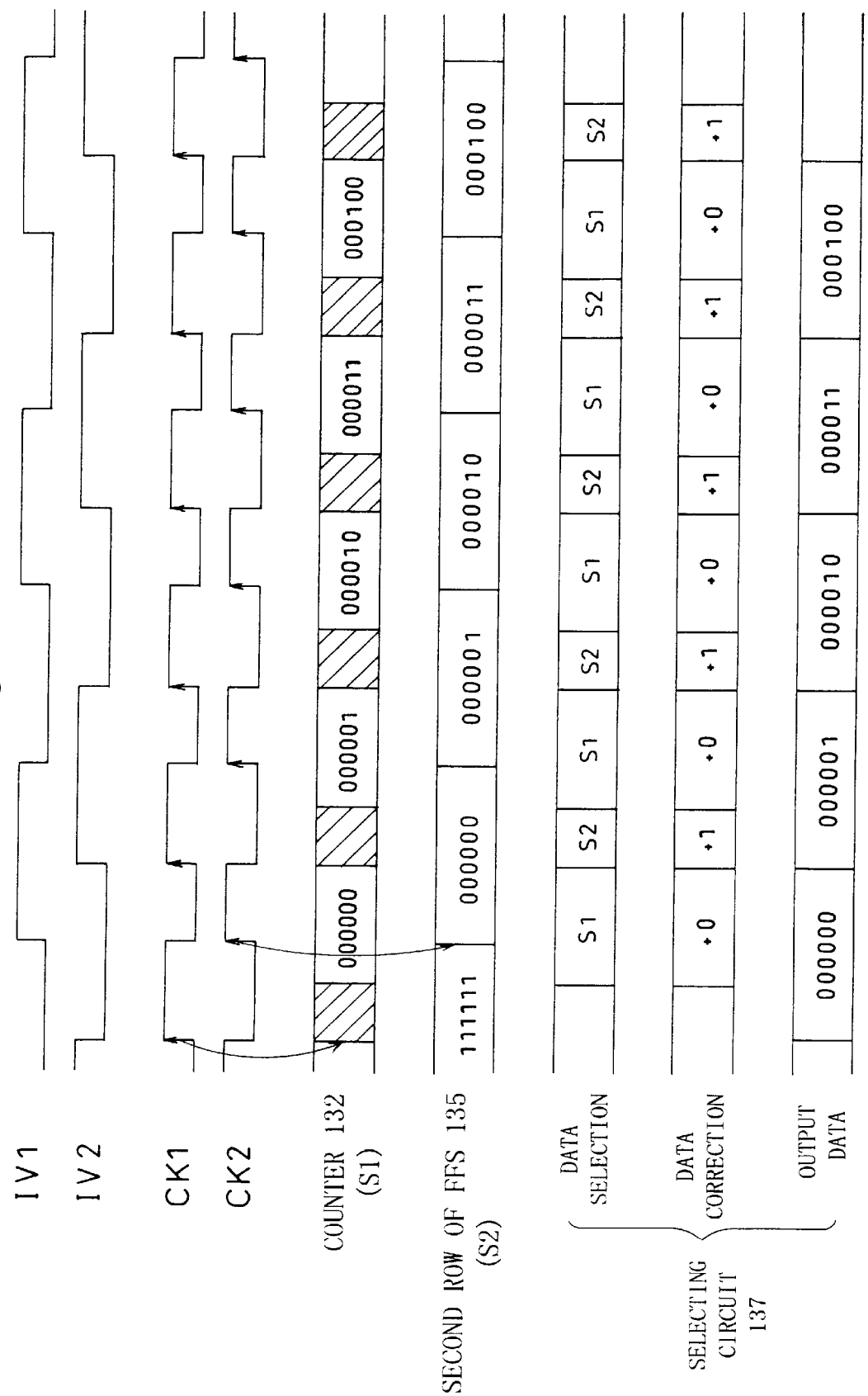
FIG. 14 illustrates the operation of the time counting circuit according to the fifth embodiment of the present invention shown in FIG. 12.

With reference to FIG. 14, a description will be given below to the operation of the time counting circuit shown in FIG. 12.

The clock generating circuit 131 combines output signals IV1 and IV2 of the 17th and 33rd inverters composing the inverter ring 111, and outputs first and second clock signals CK1 and CK2 having respective rising timings. The rising edge of the first clock signal CK1 is generated with the rising and falling timings of the output signal IV2 of the 33rd inverter. The rising edge of the second clock signal CK2 is generated with the rising and falling timings of the output signal IV1 of the 17th inverter.

The first clock signal CK1 is inputted to the counter 132, and its rising edge carries the count value of the counter 132. The counter 132 requires a certain time to carry the count value. During that time, the output value of the counter 132 is indefinite. In FIG. 14, a time for which the count value of the counter 132 is indefinite is shown by an oblique line. The second clock signal CK2 is inputted to the second row of FFs 135, and its rising edge decides the timing of the input data holding operation of the second row of FFs 135. Specifically, the second row of FFs 135 holds and outputs the count data of the counter 132 by the rising edge of the second clock signal CK2.

If the time for which the count data of the counter 132 is indefinite is less than 17 ns, the second row of FFs 135 can hold the definite count data of the counter 132. The reason is that 17 ns has passed since the counter 132 starts the carry of the count value (since the output signal of the 33rd inverter changes) because the second row of FFs 135 holds the count data of the counter 132 with the timing where the output signal of the 17th inverter changes. For this reason, the second row of FFs 135 holds the count data of the counter 132 with such timing that the time for which the count data of the counter 132 is indefinite is compensated for.

When the FM pulse signal rises, the count data of the counter 132 is held in the first row of FFs 133 and outputted to the selecting circuit 137. The data held in the second row of FFs 135 are held in the third row of FFs 136 and outputted to the selecting circuit 137.

The selecting circuit 137 selectively outputs either output data S1 of the first row of FFs 133 or output data S2 of the third row of FFs 136. The data is selected in accordance with instructions sent from the signal processing circuit 112.

The signal processing circuit 112 holds the output signal of the inverter ring 111 when the pulse signal outputted from the input converting circuit 119 rises. The current position of the signal transition in the inverter ring 111 can be found based on the held signal. When the current position of the signal transition indicates the time for which the count data of the counter 132 is definite, an instruction is given so as to select the output data S1 of the first row of FFs 133. When the current position of the signal transition indicates the time for which the count data of the counter 132 is indefinite, an instruction is given so as to select the output data S2 of the third row of FFs 136. Although the second row of FFs 135 compensates for the time for which the count data of the counter 132 is indefinite, the held data is the preceding count data. For this reason, when selecting the output data S2 of the third row of FFs 136, the selecting circuit 137 adds "1" to correct the output data S2 into accurate count data. By this correction, the output data of the selecting circuit 137 always indicates the accurate number of circulations of the signal transition.

The output data of the selecting circuit 137, that is, upper-bit data are outputted to the operating circuit 115 and combined with 6-bit numeric data outputted from the signal processing circuit 112, that is, lower-bit data so that 12-bit time data are obtained.

According to the time counting circuit of the present embodiment described above, the accurate upper-bit data can always be obtained even though the pulse signal to be measured rises when the count data of the counter for counting the number of circulations of the signal transition is indefinite.

In addition, it is sufficient that the number of counters is 1. Therefore, the resistance to a noise is the same as in the prior art. For example, there will be considered the case where the noise is mixed in the counter for counting the number of circulations of the signal transition so that the count data is changed into a false value, for example. In this case, the time data which represents the pulse spacing is obtained by the difference between the count values. Consequently, if the number of the counters is 1, the time data which are obtained before and after the noise is mixed have errors. However, the succeeding time data are not influenced and have no error.

Figure 15:
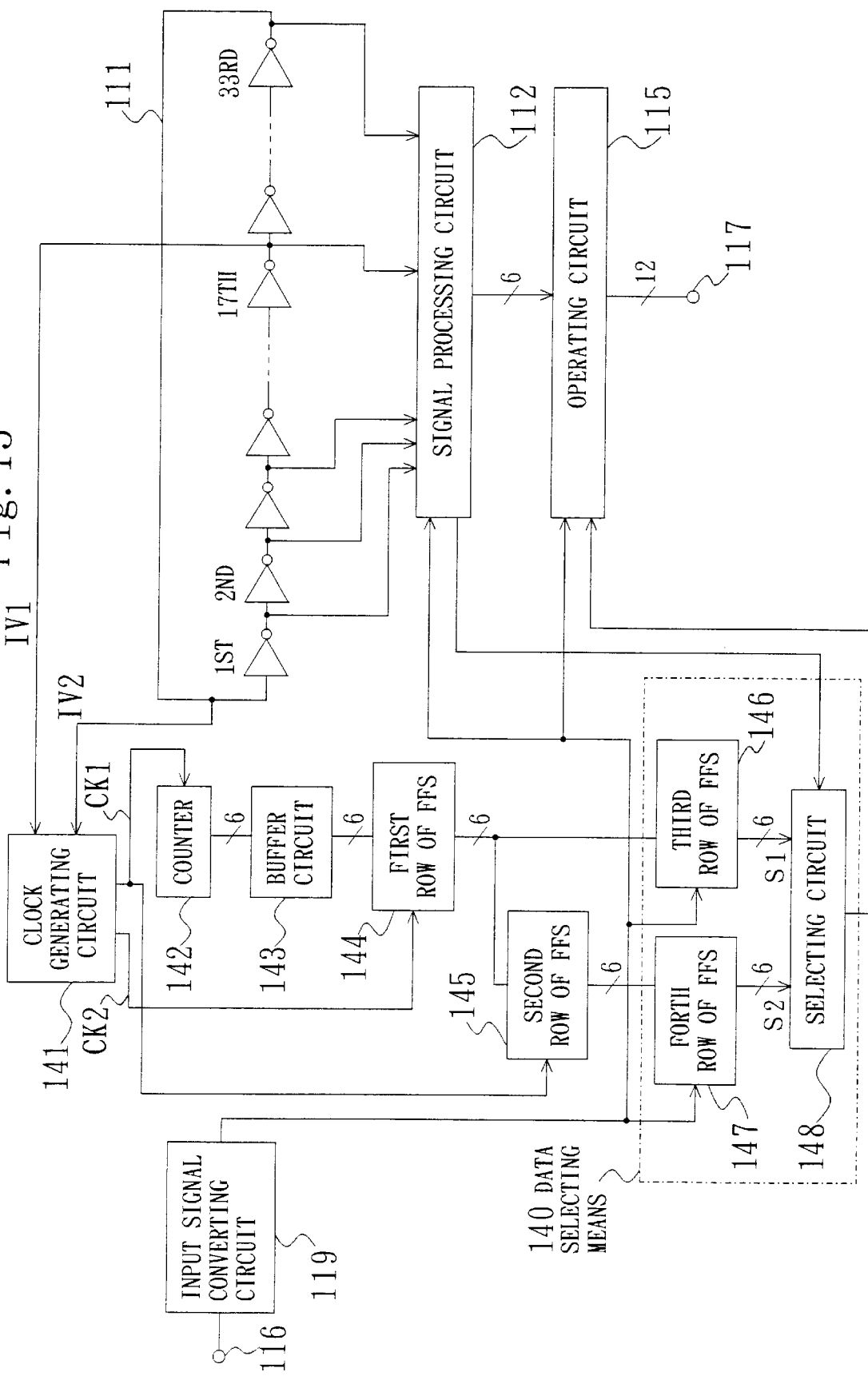
FIG. 15 shows the structure of the time counting circuit according to the fifth embodiment of the present invention.

FIG. 15 is a block diagram showing the structure of another time counting circuit according to the present embodiment, in which are shown: a clock generating circuit 141; a counter 142; a buffer circuit 143; a first row of FFs 144 which acts as first holding means; a second row of FFs 145 which acts as second holding means; a third row of FFs 146: a fourth row of FFs 147; and a selecting circuit 148. The third row of FFs 146, the fourth row of FFs 147 and the selecting circuit 148 compose data selecting means 140. Other circuits have the same structures as those of components having the same reference numerals in FIG. 12. The counter 142, the buffer circuit 143 and the first row of FFs 144 compose a first counting portion. The counter 142, the buffer circuit 143, the first row of FFs 144 and the second row of FFs 145 compose a second counting portion.

Figure 16:
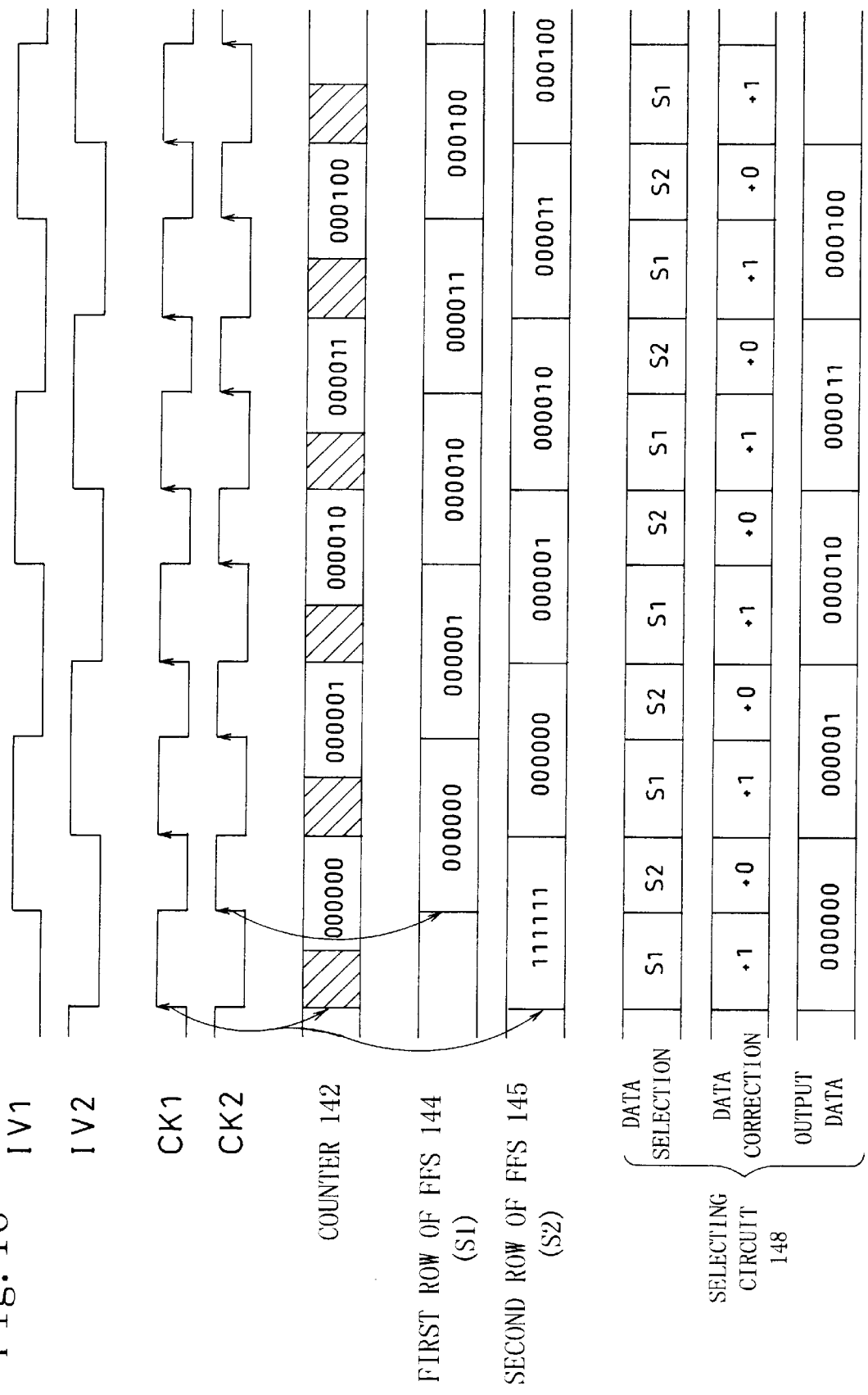
FIG. 16 illustrates the operation of the time counting circuit according to the fifth embodiment of the present invention shown in FIG. 15.

With reference to FIG. 16, a description will be briefly given below to the operation of the time counting circuit shown in FIG. 15. The clock generating circuit 141 combines output signals IV1 and IV2 of the 17th and 33rd inverters composing the inverter ring 111, and outputs first and second clock signals CK1 and CK2 having respective rising timings. The counter 142 carries the count data by "1" when the first clock signal CK1 rises. In this case, the count data of the counter 142 is indefinite for a certain time. In order to compensate for the time, the first row of FFs 144 holds the count data of the counter 142 with the rising timing of the second clock signal CK2.

The second row of FFs 145 holds the output data of the first row of FFs 144 when the first clock signal CK1 rises. When a pulse signal outputted from the input signal converting circuit 119 rises, the data held in the first row of FFs 144 are held in the third row of FFs 146 and outputted to the selecting circuit 148 and the data held in the second row of FFs 145 are held in the fourth row of FFs 147 and outputted to the selecting circuit 148. The selecting circuit 148 selects, corrects and outputs either the output data S1 of the third row of FFs 146 or the output data S2 of the fourth row of FFs 147 in accordance with an instruction sent from the signal processing circuit 112.

The time counting circuit shown in FIG. 12 holds and outputs the count data of the counter 132 by two rows of FFs. On the other hand, in the time counting circuit shown in FIG. 15, only the first row of FFs 144 holds and outputs the count data of the counter 142. Consequently, the counter 142 can be prevented from malfunctioning due to a noise.

Actually, when the time required for one circulation of the signal transition around the inverter ring is reduced, the time for which the count data of the counter is indefinite is relatively increased. For example, if the time counting circuit is used as an FM demodulating circuit, it is necessary to set a delay time for each inverter to about 0.3 ns in order to demodulate an FM signal which has recorded an image signal. Consequently, the count period of the counter 132 is about 10 ns. On the other hand, in the case where a 6-bit counter is used, the time for which the count data is indefinite is about 7 ns. Consequently, the time for which the count data is stabilized is about 3 ns. When two rows of FFs perform holding operations together within such a very short period of time, there is a possibility that the noise generated from one of the rows of FFs influences the other row of FFs or the counter so that the rows of FFs hold false data or the count data of the counter is changed by the noise. The time counting circuit shown in FIG. 15 does not have such a problem.

Figure 17:
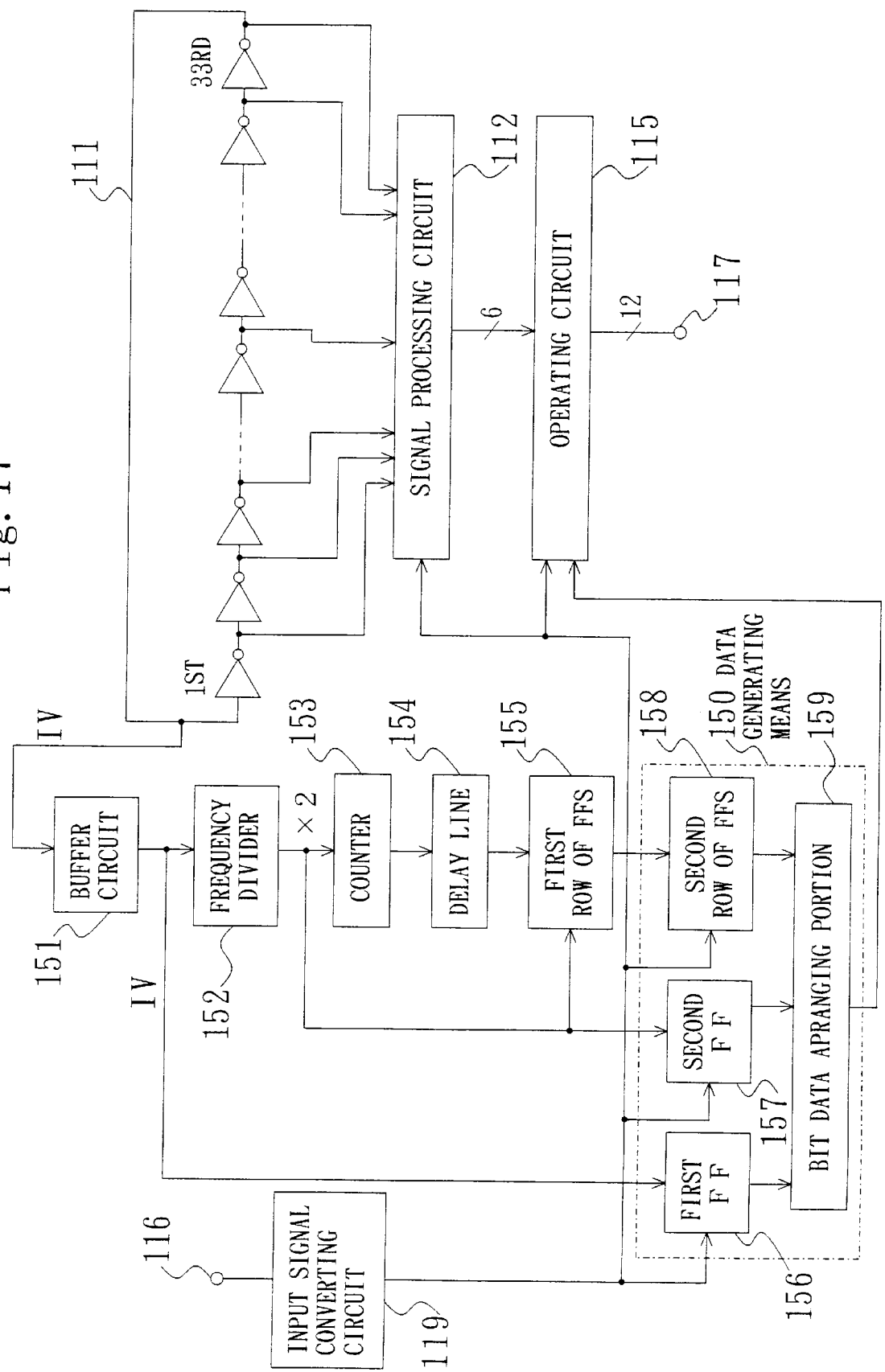
FIG. 17 shows the structure of the time counting circuit according to the fifth embodiment of the present invention.

FIG. 17 is a block diagram showing the structure of a further time counting circuit according to the present embodiment, in which are shown: a buffer circuit 151; a frequency divider 152; a counter 153; a delay line 154 which acts as delay means; a first row of FFs 155 which acts as a row of holding circuits; a first FF 156; a second FF 157; a second row of FFs 158; and a bit data arranging portion 159. The first FF 156, the second FF 157, the second row of FFs 158 and the bit data arranging portion 159 compose data generating means 150. Other circuits have the same structures as those of the circuits having the same reference numerals in FIG. 12.

Figure 18:
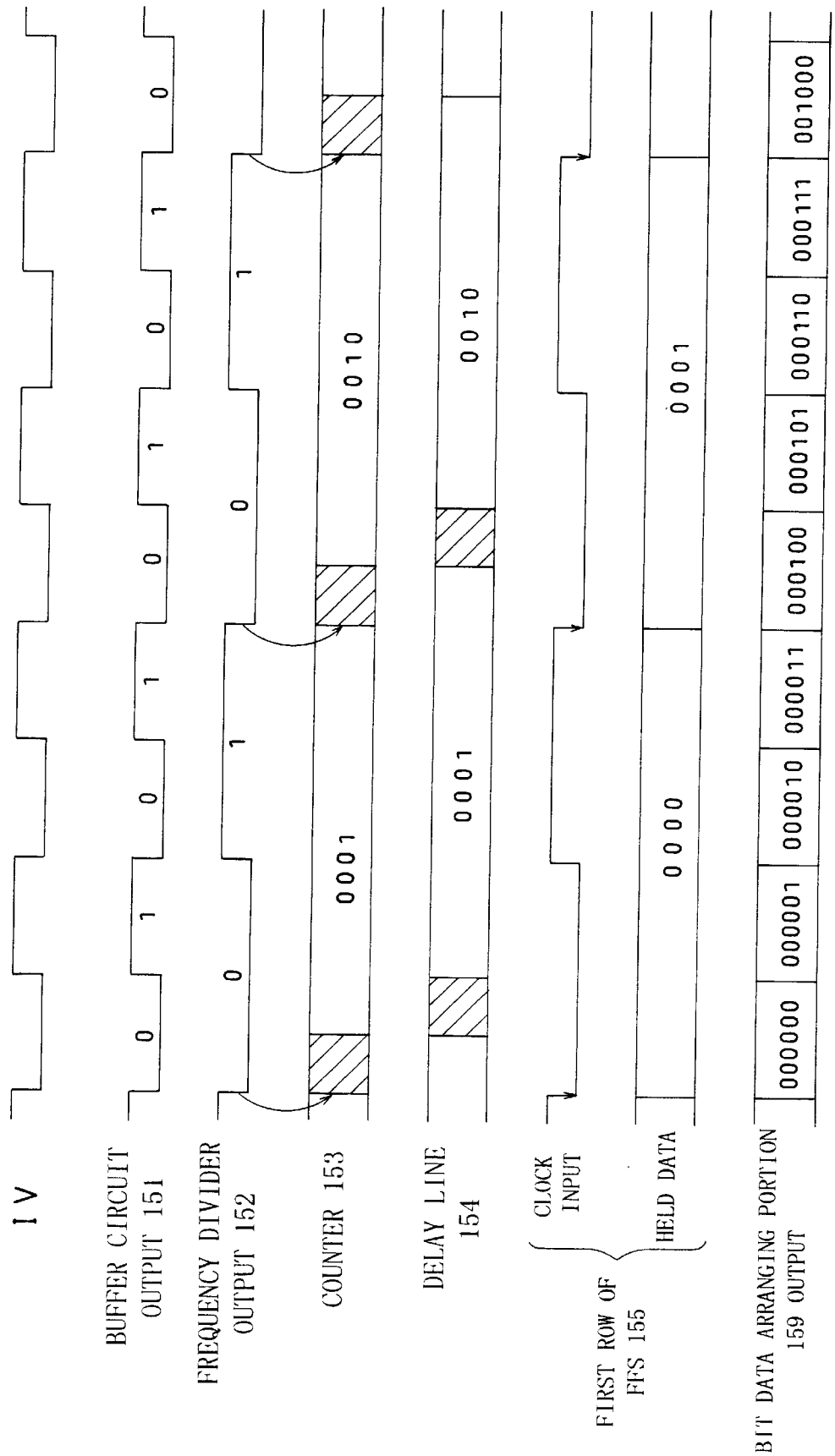
FIG. 18 illustrates the operation of the time counting circuit shown in FIG. 17.

With reference to FIG. 18, a description will be given below to the operation of the time counting circuit shown in FIG. 17.

As shown in FIG. 18, an output signal IV of the 33rd inverter composing an inverter ring 111 becomes a pulse signal having a certain period. The buffer circuit 151 outputs the pulse signal IV to the first FF 156 and the frequency divider 152. The frequency divider 152 doubles the period of the pulse signal IV. The counter 153 carries count data by "1" at the falling edge of a signal outputted from the frequency divider 152. As described above, the count data of the counter 153 becomes indefinite for a while immediately after it is carried. In FIG. 18, the time for which the count data of the counter 153 is indefinite is shown by an oblique line.

Furthermore, the count data of the counter 153 is delayed by a predetermined time through the delay line 154, and is then outputted to the first row of FFs 155. As is apparent from FIG. 18, while the output data of the delay line 154 is indefinite, the output signal of the frequency divider 152 does not fall and the first row of FFs 155 holds and outputs the output data of the delay line 154 with the falling timing of the output signal of the frequency divider 152. Consequently, the same data is always definite. Since the count data which is delayed by the predetermined time is held, a value which is smaller by "1" than the count data of the counter 153 is outputted. This does not matter in respect of the measurement of the pulse spacing. When measuring the pulse spacing, the difference between the count data is required but absolute count data which represents a specific time is not necessary. As a matter of course, the function of correcting the count data of the counter 153 may be added to the bit data arranging portion 159.

When a pulse signal outputted from the input signal converting circuit 119 rises, the first FF 156 holds the pulse signal IV outputted from the buffer circuit 151 and outputs the pulse signal IV to the bit data arranging portion 159. At the same time, the second FF 157 holds a signal outputted from the frequency divider 152 and outputs the held signal to the bit data arranging portion 159 and the second row of FFs 158 holds data outputted from the first row of FFs 155 and outputs the held data to the bit data arranging portion 159. The bit data arranging portion 159 generates output data in which a least significant bit is occupied by the output signal of the buffer circuit 151, a second bit is occupied by the output signal of the frequency divider 152 and the residual upper bits are occupied by the output data of the first row of FFs 155, and sends the output data to the operating circuit 115.

For example, when the output signal of the buffer circuit 151 is on the LOW level, the output signal of the frequency divider 152 is on the LOW level and the output data of the first row of FFs 155 is "0000", the output data of the bit data arranging portion 159 is "000000". Furthermore, when the output signal of the buffer circuit 151 is on the HIGH level, the output signal of the frequency divider 152 is on the LOW level and the output data of the first row of FFs 155 is "0000", the output data of the bit data arranging portion 159 is "000001". Thus, 6-bit data is generated and outputted as upper-bit data to the operating circuit 115.

While the time counting circuit using, as the delay circuit ring, the inverter ring in which each delay circuit is composed of one inverter has been described as an example in the present embodiment, the present invention is not restricted to such a structure but can be applied to a time counting circuit using the delay circuit ring having any structure.

The oscillation frequency of the delay circuit ring may be stabilized by a PLL circuit. For example, a phase comparator and a loop filter are provided, the output signal of one of the delay circuits composing the delay circuit ring is compared with a reference clock signal having an accurate frequency by the phase comparator, the output signal of the phase comparator is changed into a DC current by the loop filter, and the DC current is then supplied to each delay circuit composing the delay circuit ring. By such a structure, the delay time for each delay circuit is regulated until the frequency of the output signal of the delay circuit becomes equal to that of the reference clock signal. Consequently, the oscillation frequency of the delay circuit ring is stabilized.

We claim:
1. A time counting circuit, comprising:
a delay circuit ring composed of a plurality of delay circuits connected in a ring with an output of each delay circuit connected to an input of a next delay circuit, wherein a signal circulates around the delay circuit ring and transitions from one binary state to another binary state at each delay circuit; and
first and second counting portions for counting the number of circulations of the signal around said delay circuit ring, wherein
said first and second counting potions are structured such that the count data of said second counting portion remains stable while the count data of said first counting portion changes.
2. A time counting circuit according to claim 1, wherein said first counting portion comprises a first counter for counting the number of transitions of the output signal of one of said delay circuits composing said delay circuit ring, and said second counting portion comprises a second counter for counting the number of transitions of the output signal of another one of said delay circuits composing said delay circuit ring.

3. A time counting circuit according to claim 1, wherein said first and second counting portions comprise, in common, a counter for counting the number of transitions of the output signal of one of said delay circuits composing said delay circuit ring; and said second counting portion further comprises holding means for holding the count data of said counter with the transition timings of the output signal of another one of said delay circuits composing said delay circuit ring.

4. A time counting circuit according to claim 1, wherein said first and second counting portions comprise in common:

a counter for counting the number of transitions of the output signal of one of said delay circuits composing said delay circuit ring; and first holding means for holding the count data of said counter with the transition timings of the output signal of another one of said delay circuits composing said delay circuit ring, and said second counting portion further comprises second holding means for holding data output from said first holding means with the transition timing of the output signal of a further one of said delay circuits composing said delay circuit ring.

5. A time counting circuit for measuring a time such as a pulse spacing of a pulse signal, comprising:

a delay circuit ring composed of a plurality of delay circuits connected in a ring with an output of each delay circuit connected to an input of a next delay circuit, wherein a signal circulates around the delay circuit ring and transitions from one binary state to another binary state at each delay circuit;

a signal processing circuit for receiving a pulse signal to be measured, holding the output signals of said delay circuits composing said delay circuit ring with the timing of the transition of said pulse signal to be measured, converting the held signal to numeric data and outputting said numeric data, and generating and outputting a directing signal which directs the current position of the signal in said delay circuit ring based on said held signal;

a counter for counting the number of transitions of the output signal of one of said delay circuits composing said delay circuit ring;

holding means for holding the count data of said counter with the transition timings of the output signal of another one of said delay circuits composing said delay circuit ring;

data selecting means for receiving the count data of said counter and the data held in said holding means, selecting either the count data of said counter or the data held in said holding means in accordance with the directing signal output from said signal processing circuit with the timing of the transition of said pulse signal to be measured, and correcting the selected data to output corrected data as circulation number data which indicates the number of circulations of the signal around said delay circuit ring; and an operating circuit for receiving the numeric data output from said signal processing circuit and the circulation number data output from said data selecting means to operate and output time data which represents the time such as a pulse spacing of said pulse signal to be measured.

6. A time counting circuit for measuring a time such as a pulse spacing of a pulse signal, comprising:

a delay circuit ring composed of a plurality of delay circuits connected in a ring with an output of each delay circuit connected to an input of a next delay circuit, wherein a signal circulates around the delay circuit ring and transitions from one binary state to another binary state at each delay circuit;

a signal processing circuit for receiving a pulse signal to be measured, holding the output signals of said delay circuits composing said delay circuit ring with the timing of the transition of said pulse signal to be measured, converting the held signal to numeric data and outputting said numeric data, and generating and outputting a directing signal which directs the current position of the signal in said delay circuit ring based on said held signal;

a counter for counting the number of transitions of the output signal of one of said delay circuits composing said delay circuit ring;

first holding means for holding the count data of said counter with the transition timings of the output signal of another one of said delay circuits composing said delay circuit ring;

second holding means for holding the data output from said first holding means with the transition timing of the output signal of a further one of said delay circuits composing said delay circuit ring;

data selecting means for receiving the data held in said first holding means and the data held in said second holding means, selecting either the data held in said first holding means or the data held in said second holding means in accordance with the directing signal output from said signal processing circuit with the timing of the transition of said pulse signal to be measured, and correcting the selected data to output corrected data as circulation number data which indicates the number of circulations of the signal around said delay circuit ring; and an operating circuit for receiving the numeric data output from said signal processing circuit and the circulation number data output from said data selecting means to operate and output time data which represents the time such as a pulse spacing of said pulse signal to be measured.

7. A time counting circuit, comprising:

a delay circuit ring composed of a plurality of delay circuits connected in a ring with an output of each delay circuit connected to an input of a next delay circuit, wherein a signal circulates around the delay circuit ring and transitions from one binary state to another binary state at each delay circuit;

a frequency divider for receiving the output signal of one of said delay circuits composing said delay circuit ring and outputting a signal of a reduced frequency; and a counter for counting the number of transitions of the signal output from the frequency divider, wherein data in which upper bits are occupied by the count data of said counter and lower bits are occupied by the data obtained from the logic level of the output signal of said one of said delay circuits comprises circulation number data which indicates the number of circulations of the signal around said delay circuit ring.

8. A time counting circuit for measuring a time such as a pulse spacing of a pulse signal, comprising:

a delay circuit ring composed of a plurality of delay circuits connected in a ring with an output of each delay circuit connected to an input of a next delay circuit, wherein a signal circulates around the delay circuit ring and transitions from one binary state to another binary state at each delay circuit;

a signal processing circuit for receiving a pulse signal to be measured, holding the output signals of said delay circuits composing said delay circuit ring with the timing of the transition of said pulse signal to be measured, and converting the held signal to numeric data and outputting said numeric data;

a frequency divider for receiving the output signal of one of said delay circuits composing said delay circuit ring and outputting a divided-frequency signal having a period double a period of said output signal;

a counter for receiving the divided-frequency signal output from the frequency divider and counting a number of rising or falling edges of said divided-frequency signal;

delay means for delaying the count data of said counter by a predetermined time;

holding means for holding the count data delayed by said delay means with the rising or falling timing of said divided-frequency signal;

data generating means for receiving the output signal of one of said delay circuits composing said delay circuit ring, said divided-frequency signal, and the data held in said holding means, and outputting, as circulation number data which indicates the number of circulations of the signal around said delay circuit ring, data in which a least significant bit is occupied by the logic level of the output signal of said one of said delay circuits, a second least significant bit is occupied by the logic level of said divided-frequency signal, and the upper bits are occupied by the data held in said row of holding circuits with the timing of the transition of said pulse signal to be measured; and an operating circuit for receiving the numeric data output from said signal processing circuit and the circulation number data output from said data generating means to operate time data which represents the time such as a pulse spacing of said pulse signal to be measured.

* * * * *

UNITED STATES PATENT AND TRADEMARK OFFICE
CERTIFICATE OF CORRECTION

PATENT NO. : 5,835,552
DATED : November 10, 1998
INVENTOR(S) : Kusumoto et al.

It is certified that error appears in the above-identified patent and that said Letters Patent is hereby corrected as shown below:

Claim 1, line 11, change "potions" to --portions--.

Signed and Sealed this

Seventh Day of November, 2000

Attest:

Q. TODD DICKINSON

*Attesting Officer*  *Director of Patents and Trademarks*